US012681447B2

(12) United States Patent
　　Berthe

(10) Patent No.: US 12,681,447 B2
(45) Date of Patent: Jul. 14, 2026

(54) OPTIMIZED PROCESSING ENGINE OF AN INTERNET OF THINGS (IoT) DEVICE AND A METHOD OF GENERATING THE SAME

(71) Applicant: Low Power Futures, Inc., Markham (CA)

(72) Inventor: Abdoulaye Berthe, Toronto (CA)

(73) Assignee: Low Power Futures, Inc., Markham (CA)

( * ) Notice: Subject to any disclaimer, the term of this patent is extended or adjusted under 35 U.S.C. 154(b) by 828 days.

(21) Appl. No.: 18/070,707

(22) Filed: Nov. 29, 2022

(65) Prior Publication Data

US 2023/0168644 A1　　Jun. 1, 2023

Related U.S. Application Data

(60) Provisional application No. 63/285,017, filed on Dec. 1, 2021.

(51) Int. Cl.
*G06N 3/082* (2023.01)
*G05B 15/02* (2006.01)
*G06F 7/544* (2006.01)
*G06F 15/80* (2006.01)
*G06F 30/27* (2020.01)
*G06N 3/04* (2023.01)
*H05B 47/105* (2020.01)

(52) U.S. Cl.
CPC ............. *G05B 15/02* (2013.01); *G06N 3/082* (2013.01); *G06F 7/5443* (2013.01); *G06F 15/8046* (2013.01); *G06F 30/27* (2020.01); *G06F 2212/1024* (2013.01); *G06N 3/04* (2013.01); *H05B 47/105* (2020.01)

(58) Field of Classification Search
USPC .......................................................... 700/28
See application file for complete search history.

(56) References Cited

U.S. PATENT DOCUMENTS

| 11,769,044 | B2 * | 9/2023 | Zhang | .................. | G06N 3/0464 |
| | | | | | 706/27 |
| 11,803,736 | B1 * | 10/2023 | Meyer | ................... | G06F 9/3013 |
| 12,417,388 | B1 * | 9/2025 | Nataraj | ................. | G06N 3/084 |
| 2017/0364043 | A1 * | 12/2017 | Ganti | .................... | G05B 17/02 |
| 2018/0046905 | A1 * | 2/2018 | Li | ......................... | G06N 3/0464 |
| 2020/0151549 | A1 * | 5/2020 | Hwang | ............... | G06N 3/0442 |
| 2022/0012593 | A1 * | 1/2022 | Huang | ................... | G06F 8/427 |
| 2024/0232594 | A1 * | 7/2024 | Yang | ....................... | G06N 5/01 |

* cited by examiner

*Primary Examiner* — Emilio J Saavedra

(57) ABSTRACT

An optimized processing engine of an Internet of Things (IoT) device is described. The optimized processing engine is configured to perform processing operations on input data received at the IoT device. The optimized processing engine comprises an optimized number of processing units; a memory unit; and an engine controller. Each processing unit is configured to perform one or more of the processing operations. The memory unit is configured to store: (i) the input data, (ii) one or more processing parameters for performing the processing operations, and (iii) one or more intermediate outputs of the processing units while performing the processing operations. The engine controller is configured to control a loading sequence of the input data and the one or more processing parameters to the processing units while performing the processing operations. The optimized number of the processing units is determined by an optimization engine of an engine generation device.

21 Claims, 13 Drawing Sheets

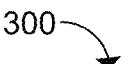

300

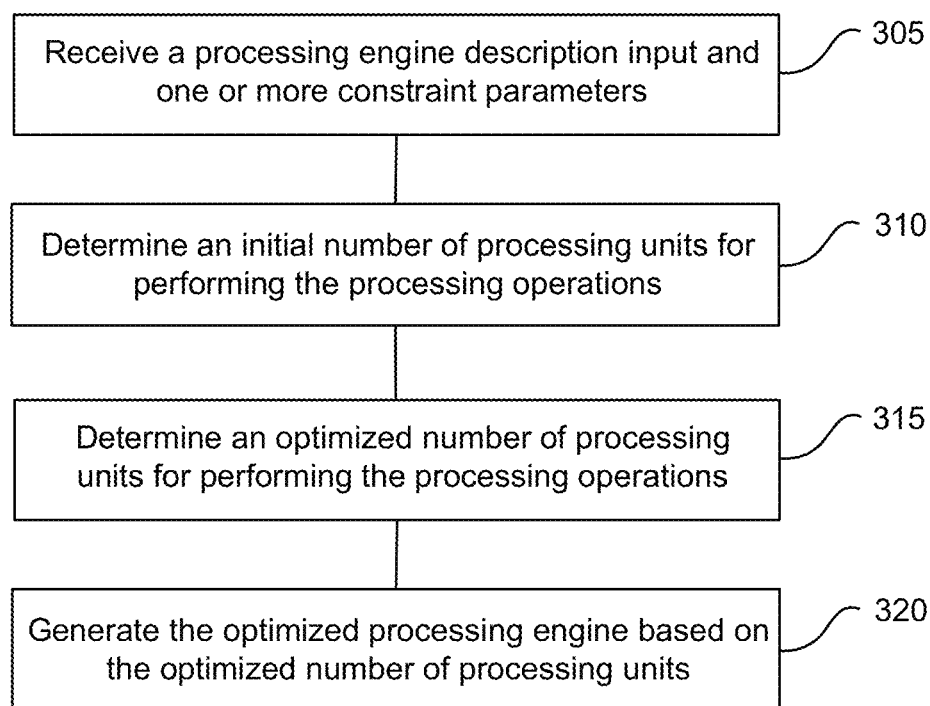

Receive a processing engine description input and one or more constraint parameters    305

Determine an initial number of processing units for performing the processing operations    310

Determine an optimized number of processing units for performing the processing operations    315

Generate the optimized processing engine based on the optimized number of processing units    320

OPTIMIZED PROCESSING ENGINE OF AN INTERNET OF THINGS (IoT) DEVICE AND A METHOD OF GENERATING THE SAME

FIELD

The described embodiments relate to an optimized processing engine of an Internet of Things (IoT) device and a method of generating the optimized processing engine.

BACKGROUND

The following is not an admission that anything discussed below is part of the prior art or part of the common general knowledge of a person skilled in the art.

In recent years, there has been a significant increase in the number of IoT devices. The number of IoT devices is estimated to reach 1 trillion by 2035. An IoT device may receive large amounts of input data. For example, IoT sensor devices may perform thousands of measurements per second. IoT devices may transmit (using, for example, communication network) the received data to a server for processing. AI and machine learning methods may be used to analyze the data at the server. However, bandwidth limitations of the communication network and data transmission rate limitations of IoT devices can make it challenging to transmit large amounts of data to the server.

Distributed processing or distributed computation can provide a solution to the data transmission problem by distributing the data processing tasks over the entire network of connected devices. For example, an IoT device may include a processing engine to process at least a portion of the received data. This can reduce the amount of data that needs to be transmitted to the server for processing. Typically, IoT devices are required to be efficient in terms of size and/or power consumption. Accordingly, the processing engines of the IoT devices may also be required to be efficient in terms of size and/or power consumption.

SUMMARY

In accordance with an aspect of the invention, some embodiments provide an optimized processing engine of an Internet of Things (IoT) device. The optimized processing engine may be configured to perform processing operations on input data received at the IoT device. The optimized processing engine may comprise an optimized number of processing units; a memory unit; and an engine controller. Each processing unit may be configured to perform one or more of the processing operations. The memory unit may be configured to store: (i) the input data, (ii) one or more processing parameters for performing the processing operations, and (iii) one or more intermediate outputs of the processing units while performing the processing operations. The engine controller may be configured to control a loading sequence of the input data and the one or more processing parameters to the processing units while performing the processing operations. The optimized number of the processing units may be determined by an optimization engine of an engine generation device by determining an initial number of the processing units for performing the processing operations based on a processing engine description input and one or more constraint parameters associated with the processing units; and iteratively changing the number of the processing units from the initial number to the optimized number, wherein the optimized number of the processing units is operable to perform the processing operations while meeting the one or more constraint parameters.

In accordance with an aspect of the invention, some embodiments provide an IoT device comprising the optimized processing engine described herein.

In accordance with an aspect of the invention, some embodiments provide a method of generating an optimized processing engine of an Internet of Things (IoT) device. The optimized processing engine may be configured to perform processing operations on input data received at the IoT device. The optimized processing engine may include an optimized number of processing units; a memory unit; and an engine controller. Each processing unit may be configured to perform one or more of the processing operations. The memory unit may be configured to store (i) the input data, (ii) one or more processing parameters for performing the processing operations, and (iii) one or more intermediate outputs of the processing units while performing the processing operations. The engine controller may be configured to control a loading sequence of the input data and the one or more processing parameters to the processing units while performing the processing operations. The method may comprise determining, by an optimization engine of an engine generation device, the optimized number of the processing units; and generating, by the engine generation device, the optimized processing engine based on the determined optimized number of the processing units. The optimized number of processing units may be determined by receiving a processing engine description input and one or more constraint parameters associated with the processing units; determining an initial number of the processing units for performing the processing operations based on the processing engine description input and the one or more constraint parameters; and iteratively changing the number of processing units from the initial number to the optimized number, wherein the optimized number of processing units is operable to perform the processing operations while meeting the one or more constraint parameters.

BRIEF DESCRIPTION OF THE DRAWINGS

The drawings included herewith are for illustrating various examples of articles, methods, and apparatuses of the present specification and are not intended to limit the scope of what is taught in any way. In the drawings:

FIG. 3 is a flowchart of an example method of generating an optimized processing engine of an IoT device, in accordance with an embodiment.

FIGS. 6B-6D are schematic diagrams showing an example iterative reduction in the number of MAC units starting from the initial configuration shown in

FIG. 6A.

DETAILED DESCRIPTION

Figure 1:
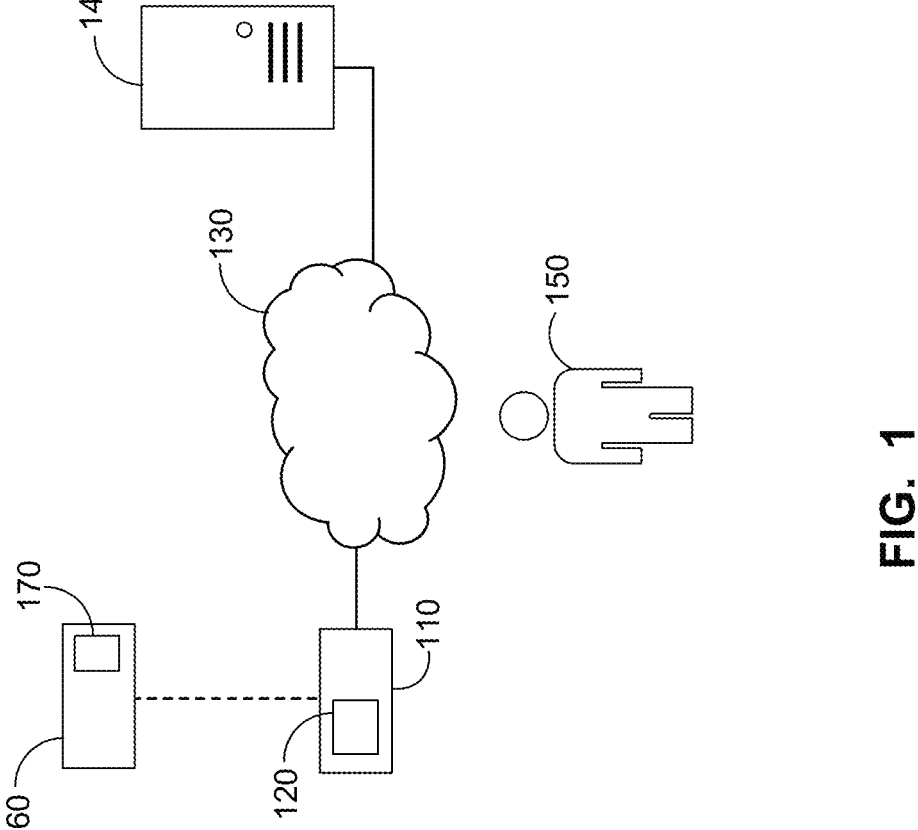
FIG. 1 is a schematic diagram of an example IoT device located in an environment, in accordance with an embodiment.

Several example embodiments are described below. Numerous specific details are set forth in order to provide a thorough understanding of the example embodiments. However, it will be understood by those of ordinary skill in the art that the embodiments described herein may be practiced without these specific details. In other instances, well-known methods, procedures and components have not been described in detail so as not to obscure the embodiments described herein. Furthermore, this description and the drawings are not to be considered as limiting the scope of the embodiments described herein in any way, but rather as merely describing the implementation of the various embodiments described herein.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formant sense unless expressly so defined herein.

The terms "an embodiment," "embodiment," "embodiments," "the embodiment," "the embodiments," "one or more embodiments," "some embodiments," and "one embodiment" mean "one or more (but not all) embodiments of the present invention(s)," unless expressly specified otherwise.

The terms "including," "comprising" and variations thereof mean "including but not limited to," unless expressly specified otherwise. A listing of items does not imply that any or all of the items are mutually exclusive, unless expressly specified otherwise. The terms "a," "an" and "the" mean "one or more," unless expressly specified otherwise.

As used herein and in the claims, two or more parts are said to be "coupled", "connected", "attached", "joined", "affixed", or "fastened" where the parts are joined or operate together either directly or indirectly (i.e., through one or more intermediate parts), so long as a link occurs. As used herein and in the claims, two or more parts are said to be "directly coupled", "directly connected", "directly attached", "directly joined", "directly affixed", or "directly fastened" where the parts are connected in physical contact with each other. As used herein, two or more parts are said to be "rigidly coupled", "rigidly connected", "rigidly attached", "rigidly joined", "rigidly affixed", or "rigidly fastened" where the parts are coupled so as to move as one while maintaining a constant orientation relative to each other. None of the terms "coupled", "connected", "attached", "joined", "affixed", and "fastened" distinguish the manner in which two or more parts are joined together.

Further, although method steps may be described (in the disclosure and/or in the claims) in a sequential order, such methods may be configured to work in alternate orders. In other words, any sequence or order of steps that may be described does not necessarily indicate a requirement that the steps be performed in that order. The steps of methods described herein may be performed in any order that is practical. Further, some steps may be performed simultaneously.

As used herein and in the claims, a group of elements are said to "collectively" perform an act where that act is performed by any one of the elements in the group, or performed cooperatively by two or more (or all) elements in the group.

As used herein and in the claims, a first element is said to be "received" in a second element where at least a portion of the first element is received in the second element unless specifically stated otherwise.

Some elements herein may be identified by a part number, which is composed of a base number followed by an alphabetical or subscript-numerical suffix (e.g., $112a$, or $112_1$). Multiple elements herein may be identified by part numbers that share a base number in common and that differ by their suffixes (e.g., $112a$, $112b$, and $112c$). All elements with a common base number may be referred to collectively or generically using the base number without a suffix (e.g., $112$).

It should be noted that terms of degree such as "substantially", "about" and "approximately" when used herein mean a reasonable amount of deviation of the modified term such that the end result is not significantly changed. These terms of degree should be construed as including a deviation of the modified term if this deviation would not negate the meaning of the term it modifies.

In addition, as used herein, the wording "and/or" is intended to represent an inclusive-or. That is, "X and/or Y" is intended to mean X or Y or both, for example. As a further example, "X, Y, and/or Z" is intended to mean X or Y or Z or any combination thereof.

Described herein are an optimized processing engine of an IoT device and a method of generating the same. The optimized processing engine may have an optimized number of processing units. The number of processing units may be optimized based on different constraint parameters. For example, the number of processing units may be optimized based on constraint parameters specifying, such as, for example, the total number of the processing units, total area of the processing units, total power consumption of the processing units while performing the processing operations, and/or latency time constraint of the processing units to perform a set of processing operations.

The optimization of the processing engine may enable customization of IoT devices for specific requirements. For example, the optimized processing engine may have a minimum number of processing units required to perform the required processing operations to enable customization of an IoT device to meet small size requirements. As another example, the optimized processing engine may have a minimum total power consumption of the processing units while performing the required processing operations to enable customization of an IoT device to meet low power consumption requirements. As another example, an IoT device may have performance metric requirements including a maximum amount of time needed to perform a specific processing operation. The number of processing units may be optimized to meet latency time constraints that enable performing the specific processing operation within the maximum amount of time specified.

An IoT device may receive input data with different input widths (e.g., 8 bit data, 12 bit data etc.). The IoT device may also be required to provide an output with a specific output width, which may be the same or different compared with the input width. The disclosed processing engine may support variable input and output width operations, thereby enabling the IoT device to meet different input and output width requirements.

The disclosed systems and methods can also provide an automated testing environment. The automated testing environment can generate predicted output results for a test input and enable testing and validation of the generated optimized processing engine.

The disclosed systems and methods can enable a configurable framework for the generation of power-efficient and area-efficient acceleration mechanisms for distributed processing application (e.g., distributed machine learning applications like Deep Neural Networks (DNN) and Convolutional Neural Networks (CNN)).

Referring now to FIG. 1, shown therein is a schematic diagram of an IoT device 110 located in an environment 100. Environment 100 may also include a network 130, a server 140, a user 150 and an engine generation device 160.

IoT device 110 can be any suitable device that connects to a communication network (e.g., network 130) and communicates with other devices, systems and/or users. For example, IoT device 110 may include sensor devices such as thermostats or cameras. In some embodiments, IoT device 110 may include devices such as hearing aid devices, smart doorbells, lighting fixtures, home security systems and other home appliances.

IoT device 110 may include an optimized processing engine 120. The optimized processing engine 120 can have any suitable design to perform processing operations on input data received at the IoT device 110. The optimized processing engine 120 may generate one or more output results by processing the received input data. As one example, the IoT device 110 can be a smart camera device and the optimized processing engine 120 can be a low-power neural network processor (LP-NNP) that performs detection and classification of the captured video data. As another example, the IoT device 110 can be a hearing aid device and the optimized processing engine 120 can be a LP-NNP that processes the sensed audio data to determine the type of environment (e.g., indoors, outdoors, busy street, theater, etc.) and adjusts the hearing experience accordingly.

The optimized processing engine 120 may include an optimized number of processing units. Each processing unit can have any design suitable to perform one or more of the processing operations. For example, the optimized processing engine 120 can include a neural network model and the processing units can include multiply-accumulate (MAC) units arranged in layers corresponding to the layers in the neural network model. As another example, the processing engine may include a Kalman filter estimator and the processing units include systolic arrays.

Network 130 can be any suitable network that enables IoT device 110 to communicate with other devices, systems, and/or users. For example, network 130 may be a communication network such as the Internet, a Wide-Area Network (WAN), a Local-Area Network (LAN), or another type of network. Network 130 may include a point-to-point connection, or another communications connection between two nodes.

Server 140 can be any suitable networked computing device or system that includes a processor and a memory. Server 140 may communicate with IoT device 110 and/or user 150 using network 130. Server 140 may include one or more computing devices or systems that are communicably coupled to each other. The computing device may be a personal computer, a workstation, a server, a portable computer, or a combination of these. Server 140 may provide control inputs or data inputs to IoT device 110. In some embodiments, the IoT device 110 may provide, to server 140, output results generated by processing the input data.

User 150 can be any user associated with IoT device 110. User 150 may provide data inputs that are processed by IoT device 110. In some embodiments, user 150 may also provide control inputs to IoT device 110. For example, user 150 may provide the control inputs directly to IoT device 110 using a human-machine interface of IoT device 110. In some examples, user 150 may provide control inputs to IoT device 110 using a device connected to network 130. In some embodiments, the IoT device 110 may provide, to user 150, output results generated by processing the input data.

The IoT device 110 may be generated by an engine generation device 160. In some embodiments, the environment 100 may not include the engine generation device 160 and the engine generation device 160 may be located in another environment. The engine generation device 160 may generate the optimized processing engine 120 in the other environment and the optimized processing engine 120 may be transferred (after generation) to environment 100 for usage.

Figure 2:
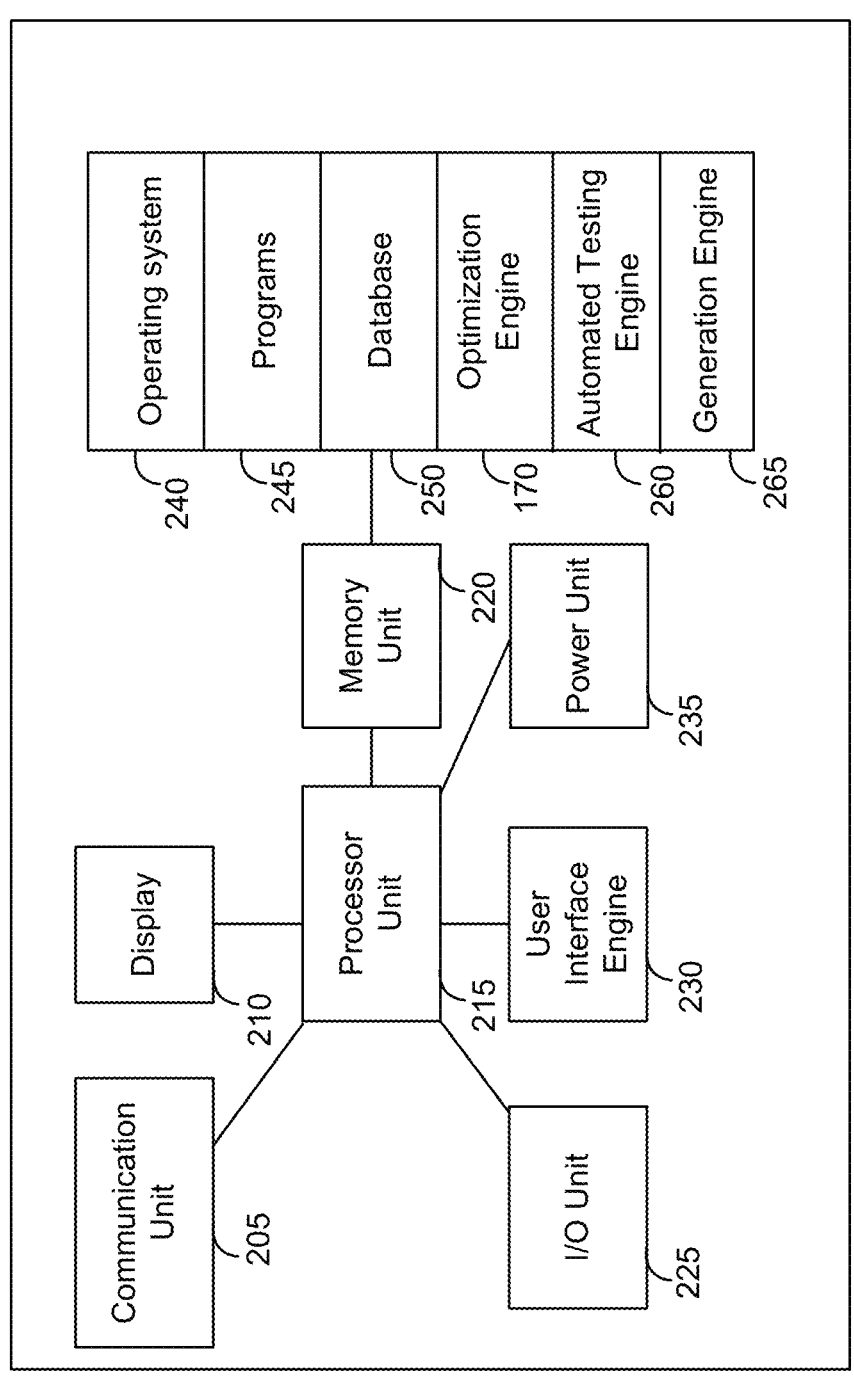
FIG. 2 is a block diagram of an example engine generation device that may be used to generate an optimized processing engine of the IoT device of FIG. 1.

The engine generation device 160 may have any design suitable to generate the optimized processing engine 120. Referring now to FIG. 2, shown therein is a block diagram of the engine generation device 160. As shown in FIG. 2, the engine generation device 160 may include a communication unit 205, a display 210, a processor unit 215, a memory unit 220, an I/O unit 225, a user interface engine 230 and a power unit 235.

Communication unit 205 can include wired or wireless connection capabilities. Communication unit 205 can be used by engine generation device 160 to communicate with other devices or computers. For example, engine generation device 160 may use communication unit 205 to receive a processing engine description input and/or constraint parameters associated with the processing units of a processing engine.

Processor unit 215 can control the operation of engine generation device 160. Processor unit 215 can be any suitable processor, controller or digital signal processor that can provide sufficient processing power depending on the configuration, purposes and requirements of engine generation device 160 as is known by those skilled in the art. For example, processor unit 215 may be a high-performance general processor. For example, processor unit 215 may include a standard processor, such as an Intel® processor, or an AMD® processor. Alternatively, processor unit 215 can include more than one processor with each processor being configured to perform different dedicated tasks. Alternatively, specialized hardware (e.g., graphical processing units (GPUs)) can be used to provide some of the functions provided by processor unit 215.

Processor unit 215 can execute a user interface engine 230 that may be used to generate various user interfaces. User interface engine 230 may be configured to provide a user interface on display 210. Optionally, engine generation device 160 may be in communication with external displays using communication unit 205. User interface engine 230 may also generate user interface data for the external displays that are in communication with engine generation device 160.

User interface engine 230 can be configured to provide a user interface to an operator of engine generation device 160. For example, user interface engine 230 can be configured to receive an engine description input for a processing engine that needs to be generated for an IoT device. As another example, user interface engine 230 can also be configured to provide a user interface to receive constraint parameters associated with the processing units of the processing engine to generate an optimized processing engine.

Display 210 may be a LED or LCD based display and may be a touch sensitive user input device that supports gestures. Display 210 may be integrated into engine generation device 160. Alternatively, display 210 may be located physically remote from engine generation device 160 and communicate with engine generation device 160 using, for example, communication unit 205.

I/O unit 225 can include at least one of a mouse, a keyboard, a touch screen, a thumbwheel, a trackpad, a trackball, a card-reader, voice recognition software and the like, depending on the particular implementation of engine generation device 160. In some cases, some of these components can be integrated with one another. I/O unit 225 may enable an operator of engine generation device 160 to interact with the user interfaces provided by user interface engine 230.

Power unit 235 can be any suitable power source that provides power to engine generation device 160 such as a power adaptor or a rechargeable battery pack depending on the implementation of engine generation device 160 as is known by those skilled in the art.

Memory unit 220 includes software code for implementing an operating system 240, programs 245, database 250, optimization engine 170, automated testing engine 260 and generation engine 265.

Memory unit 220 can include RAM, ROM, one or more hard drives, one or more flash drives or some other suitable data storage elements such as disk drives, etc. Memory unit 220 can be used to store an operating system 240 and programs 245 as is commonly known by those skilled in the art. For instance, operating system 240 provides various basic operational processes for engine generation device 160. For example, the operating system 240 may be an operating system such as Windows® Server operating system, or Red Hat® Enterprise Linux (RHEL) operating system, or another operating system.

Database 250 may include a Structured Query Language (SQL) database such as PostgreSQL or MySQL or a not only SQL (NoSQL) database such as MongoDB, or Graph Databases, etc. Database 250 may be integrated with engine generation device 160. Alternatively, database 250 may run independently on a database server in network communication with engine generation device 160.

Database 250 may store the received engine description input and received constraint parameters. In some embodiments, database 250 may store the optimized processing engine output generated by, for example, generation engine 265.

Programs 245 can include various programs so that engine generation device 160 can perform various functions such as, but not limited to, receiving the engine description input and constraint parameters, determining the optimized number of processing units, and generating the optimized processing engine.

Optimization engine 170 can determine an optimized number of processing units for a processing engine of an IoT device. Optimization engine 170 can determine the optimized number based on received engine description input and constraint parameters, as described in further detail herein with reference to FIG. 3.

Generation engine 265 can generate the optimized processing engine output based on the optimized number of processing units determined by optimization engine 170. For example, generation engine 265 can generate an output defining the optimized processing engine in different formats including, for example, Register Transfer Level Language (RTL) format, Netlist format or Graphic Data System (GDS) format, etc.

Automated testing engine 260 can generate an automated testing environment for testing and validation of the optimized processing engine generated by generation engine 265. The automated testing environment can generate predicted output results for a test input and enable testing and validation of the generated optimized processing engine.

Referring now to FIG. 3, shown therein is a flowchart of an example method 300 of generating an optimized processing engine of an IoT device, in accordance with an embodiment. Method 300 can be implemented using, for example, engine generation device 160 and reference is made concurrently to FIGS. 1 and 2 showing engine generation device 160 and its components.

Method 300 can be performed at various times. For example, method 300 may be performed in response to input received from an operator of engine generation device 160. Method 300 may also be performed automatically, for example, according to a stored schedule (e.g., a schedule stored in database 250).

At 305, method 300 may include receiving a processing engine description input and one or more constraint parameters associated with the processing units of the processing engine. For example, the engine generation device 160 may receive, via communication unit 205, a processing engine description input and one or more constraint parameters.

In some embodiments, the processing engine may include a neural network model. The neural network model may be trained using training data that includes a set of input data and a set of corresponding output data. The trained neural network model may be used to generate outputs for any input data received at the IoT device.

Figure 4:
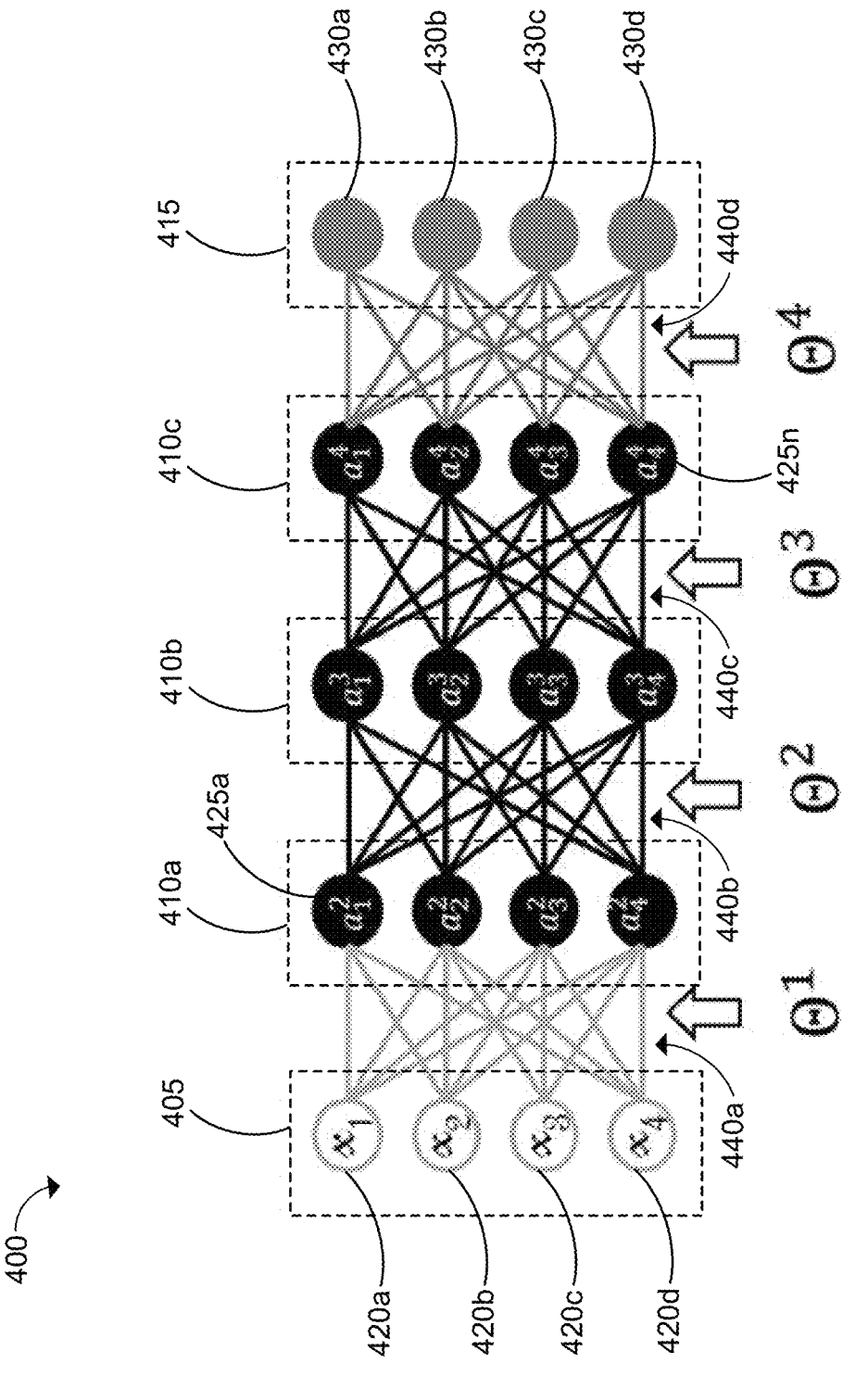
FIG. 4 is a schematic diagram of an example neural network model, in accordance with an embodiment.

Reference is now made to FIG. 4 showing a schematic diagram of an example neural network model 400. The processing engine may use the neural network model 400 to process input data received at the IoT device. As shown in FIG. 4, neural network model 400 may include an input layer 405, multiple hidden layers 410*a*-410*c* (also referred to herein as hidden layer(s) 410) and an output layer 415.

Each layer of neural network model 400 may include one or more activation units, also referred to as neurons. For example, input layer 405 may include neurons 420*a*-420*d*. Output layer 415 may include neurons 430*a*-430*d*. The hidden layers 410*a*-410*c* may include neurons 425*a*-425*n*. The layers of neural network model 400 may be interconnected using weighted arcs also referred to synaptic connections 440. The synaptic connections 440 may enable the outputs computed by neurons in one layer to be propagated as inputs to the next layer. For example, the synaptic connection 440*c* may enable the outputs computed by neurons in layer 410*b* to be propagated to the neurons in layer 410*c*.

The output of a neuron may be computed by applying a function to the inputs received at that neuron. In some embodiments, the output of a neuron may be a sigmoidal function applied to the weighted sum of the inputs at that neuron. For example, if "$x_i$" represents the element at position "i" in an input data vector to the neural network model 400, then the input data vector "x" can be represented as:

$$x = [x_1 x_2 x_3 x_4] \quad \text{(Equation 1)}$$

Further, if "$a_i^j$" denotes the activation of unit "i" in layer "j", with $a_i^0 = x_i$, then the matrix of weights "$\theta^1$" controlling the propagation of outputs from a layer "j" to layer "j+1" can be represented as:

$$\theta^1 = \begin{bmatrix} \theta_{11}^1 & \cdots & \theta_{14}^1 \\ \vdots & \ddots & \vdots \\ \theta_{41}^1 & \cdots & \theta_{44}^1 \end{bmatrix} \quad \text{(Equation 2)}$$

The output of a neuron from layer "j" may be multiplied by a weight from the weight matrix and used as the input for a neuron in layer "j+1", as represented in Equations 3-6.

$$a_1^2 = g(\theta_{11}^1 x_1 + \theta_{12}^1 x_2 + \theta_{13}^1 x_3 + \theta_{14}^1 x_4) \quad \text{(Equation 3)}$$

$$a_2^2 = g(\theta_{21}^1 x_1 + \theta_{22}^1 x_2 + \theta_{23}^1 x_3 + \theta_{24}^1 x_4) \quad \text{(Equation 4)}$$

$$a_3^2 = g(\theta_{31}^1 x_1 + \theta_{32}^1 x_2 + \theta_{33}^1 x_3 + \theta_{34}^1 x_4) \quad \text{(Equation 5)}$$

$$a_4^2 = g(\theta_{41}^1 x_1 + \theta_{42}^1 x_2 + \theta_{43}^1 x_3 + \theta_{44}^1 x_4) \quad \text{(Equation 6)}$$

with $$g(x) = \frac{1 - e^{-x}}{1 + e^{-x}} \quad \text{(Equation 7)}$$

Figure 5:
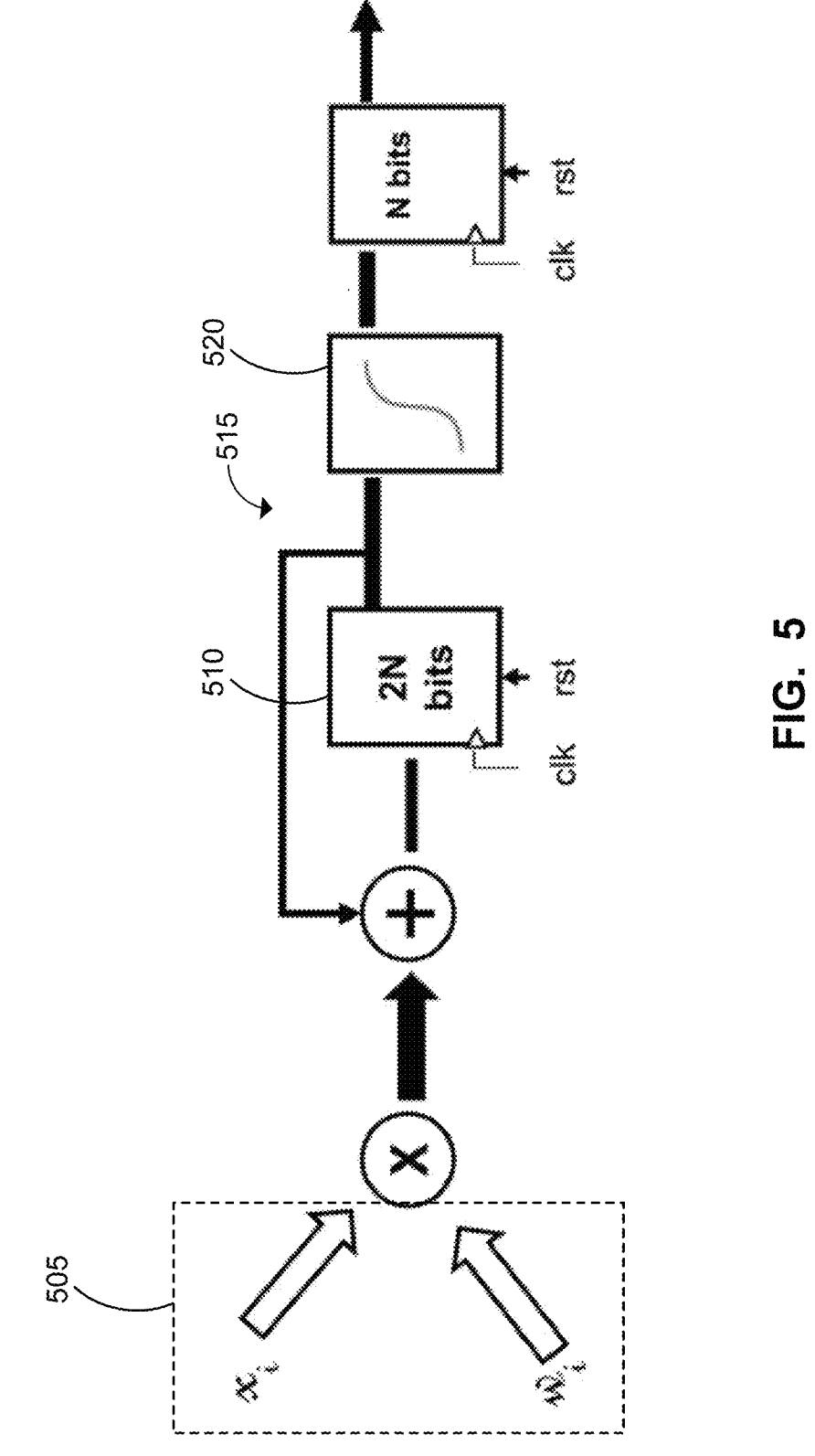
FIG. 5 is a schematic diagram of an example MAC unit that can be used to perform processing operations at a neuron of the neural network model of FIG. 4.

In some embodiments, MAC units may be used as processing units to perform the processing operation at each neuron of neural network model 400. Referring now to FIG. 5, shown therein is a schematic diagram 500 of an example MAC unit 510 that can be used to perform processing operations at a neuron of neural network model 400. For example, MAC unit 510 can be used to perform the processing operation to compute $a_1^2$ in Equation 3.

MAC unit 510 may perform the computation in four consecutive clock cycles. During each clock cycle, MAC unit 510 may receive two n-bit inputs (e.g., $x_i$ and $w_i$), compute a 2n-bit product of the inputs and add the computed multiplication results to the previous content of the MAC unit. The content of the MAC unit may be set to zero at the beginning of a new set of processing operations or when a reset signal to the MAC unit is asserted. For example, the content of the MAC unit may be set to zero and the input 505 to the MAC unit 510, that can be represented as [$w_i$, $x_i$], may be set to the pair [$\theta_{11}^1$, $x_1$] during a first clock cycle. MAC unit 510 may compute a product of $\theta_{11}^1$ with $x_1$ and accumulate it with the previous content of the MAC unit 510 (in this example, previous content is zero for the first clock cycle). Further, the input 505 to the MAC unit 510 may be set to the pair [$\theta_{12}^1$, $x_2$] during a second clock cycle, to the pair [$\theta_{13}^1$, $x_3$] during a third clock cycle, and to the pair [$\theta_{14}^1$, $x_4$] during a fourth clock cycle. At the end of each clock cycle the accumulated content of MAC unit 510 includes an additional multiplication result. After four clock cycles, the output 515 of the MAC unit 510 may equal $a_1^2$.

The output 515 of the MAC unit 510 may be twice (e.g., 2N bits) the input width (e.g., N bits). After the computation is complete (four clock cycles in the described example), the output 515 of the MAC unit 510 may be provided to an activation function and the content of MAC unit 510 may be cleared to zero.

In some embodiments, a sigmoid activation function 520 may be used as an activation function. In other embodiments, a different activation function (e.g., a linear activation function, etc.) may be used. The sigmoid activation function 520 can provide a continuous, non-linear output between 0 and 1 for a range of inputs $a_i^j$. The output "$y_j$" of the sigmoid activation function 520 may be represented as:

$$y_j = \frac{1 - e^{-\sigma_j}}{1 + e^{-\sigma_j}} \quad \text{(Equation 8)}$$

with $$\sigma_j = \sum_i x_i w_{ij} \quad \text{(Equation 9)}$$

where $x_i$ are the inputs to the activation unit and $w_{ij}$ are the weights associated with the connections between i and j in the neural network model.

The sigmoid activation function 520 may be included in the optimized processing engine 120 as a Taylor series decomposition hardware implementation. In some embodiments, the sigmoid activation function 520 may be included in the optimized processing engine 120 as a read-only memory (ROM) look-up table. A sigmoid quantization parameter may be used to determine the number of bits used to represent the data in the ROM look-up table used to compute the sigmoid activation function output "$\hat{y}_j$" to approximate the values of "$y_j$" determined using Equation 8. If "n" denotes the number of bits per quantization sample, the number of entries "m" in the ROM look-up table may be denoted as $2^n$, wherein $\log_2(m) = n$.

Dividing the sigmoid quadrant into m intervals can enable defining the output of sigmoid activation function 520 as a staircase function that is more suitable for digital computers compared with a continuous function. The values of $\sigma_j$ and $\hat{y}_j$ can be normalized and stored in the ROM look-up table. For example, the sigmoid quadrant may be divided into m steps with a spacing of 1/m as follows:

$$y_0 = 0 \text{ when } \sigma_0 = 0 \text{ and } \hat{y}_0 = 0; \quad \text{(Equation 10)}$$

$0 < y < 1/m$, $\sigma_1$ can be evaluated for 1/m using Equation 8 and $\hat{y}_1$ can be taken as the middle of the interval [0, 1/m] and represents the output of the sigmoid for $0 < \sigma < \sigma_1$;

$1/m$ $y \le 2/m$, $\sigma_2$ can be evaluated for 2/m using Equation 8 and $\hat{y}_2$ can be taken as the middle of the interval [1/m, 2/m] and represents the output of the sigmoid for $\sigma_1 \le \sigma < \sigma_2$;

. . .

$m-1/m \le y$, $\sigma_m$ can be evaluated for m−1/m using Equation 8 and $\hat{y}_m$ can be taken as the middle of the interval [m−1/m, 1] and represents the output of the sigmoid for $\sigma_{m-1} \le \sigma$.

Referring back to FIG. 3, the processing engine description input received at 305 may provide a description of the processing engine. For example, the processing engine description input may specify that the optimized processing engine to be generated for the IoT device includes a neural network model (e.g., neural network model 400 shown in FIG. 4). The processing engine description input may also include the number of layers in the neural network model (e.g., 5 layers for the example neural network model 400 shown in FIG. 4), the maximum number of neurons per layer in the neural network model (e.g., maximum number of neurons per layer is 4 for the example neural network model 400 shown in FIG. 4), and/or feature size of the neural network model (e.g., feature size is 4 for the example neural network model 400 shown in FIG. 4). In some embodiments, the processing engine description input may also include input width of the processing engine (e.g., N bits as shown in FIG. 5), an output width of the processing engine (e.g., N bits as shown in FIG. 5), and an activation function (e.g., the sigmoid activation function 520).

At 305, the received constraint parameters may specify constraints associated with the processing units of the processing engine. For an example optimized processing engine including a neural network model (e.g., neural network model 400 shown in FIG. 4) and wherein the processing units of the processing engine include MAC units (e.g., MAC units 510 shown in FIG. 5), the received constraint parameters may specify the total number of the MAC units and/or the total power consumption of the MAC units while performing the processing operations.

In some embodiments, the received constraint parameters may specify a total area of the MAC units. For each semiconductor manufacturing process, there can be a specific relationship between a logic element like a MAC unit and the equivalent chip area needed to implement that logic element. Accordingly, the constraint specifying the total area of the MAC units can be converted to a constraint specifying the total number of the MAC units and vice-versa.

In some embodiments, the received constraint parameters may also include constraints specifying the number and/or area associated with other elements of the processing engine including, for example, memory blocks, registers etc.

In some embodiments, the received constraint parameters may also include a latency time constraint of the processing units to perform a set of the processing operations. For an example optimized processing engine including a neural network model (e.g., neural network model 400 shown in FIG. 4), the latency time constraint may specify the maximum time between providing the input at layer 405 and receiving the final computed output at layer 415. The time required to perform the processing operations can depend on the total number of layers of the neural network model, the maximum number of neurons per layer, the number of MAC units available to perform the required processing operations, and the frequency of the clock signal.

As one example, method 400 may be used to generate an optimized processing engine including a LP-NNP for a smart camera IoT device. The constraint parameters associated with the LP-NNP may depend on the video format and the processing speed requirements of the smart camera IoT device. A designer of the smart camera IoT device may want the LP-NNP to be as small as possible while meeting the latency time requirements. For an example video format of RGB 128×128 pixels and a latency time requirement of 3 ms, the designer may determine a smallest-possible configuration of the LP-NNP (including, for example, the number of layers of the neural network model and the maximum number of neurons per layer) that meets all the requirements of the video application. Based on the determined configuration of the LP-NNP, the designer may then provide a processing engine description input and constraint parameters to the engine generation device.

As another example, method 400 may be used to generate an optimized processing engine including a LP-NNP for a hearing aid IoT device. The hearing aid IoT device may process sensed audio data to determine the type of environment (e.g., indoors, outdoors, busy street, theater) and adjust the hearing experience accordingly. The constraint parameters associated with the LP-NNP may depend on the number of bits used to encode the sensed audio data and the processing speed requirements of the hearing aid IoT device. For an input microphone that uses a PCM codec on 8-bits and a latency requirement of 1 ms, a software model may be used to determine a smallest-possible configuration of the LP-NNP (including, for example, the number of layers of the neural network model and the maximum number of neurons per layer) that meets all the audio processing requirements. Based on the determined configuration of the LP-NNP, the processing engine description input and constraint parameters for the hearing aid IoT device may be provided to the engine generation device.

At 310, method 300 may include determining an initial number of the processing units for performing the processing operations. The initial number of the processing units may be determined based on the processing engine description input and the one or more constraint parameters received at 305. The initial number of the processing units may be determined, for example, by optimization engine 170 shown in FIGS. 1 and 2.

As a first example, the processing engine description input received at 305 may specify that the optimized processing engine includes a neural network model and that the processing units include MAC units. The processing engine description input may also specify that the neural network model includes N layers of neurons and that the feature size of the input data vector is M. Further, the constraint parameters received at 305 may include a latency time constraint but no constraints on the number of MAC units. For example, the constraint parameters may include a latency time constraint of 1 ms. For a clock frequency of 1 MHz, the latency time constraint of 1 ms may be determined as 1000 clock cycles. In this example, the initial number of MAC units may be determined to be M×N (configured as a matrix of M rows and N columns).

Figure 6A:
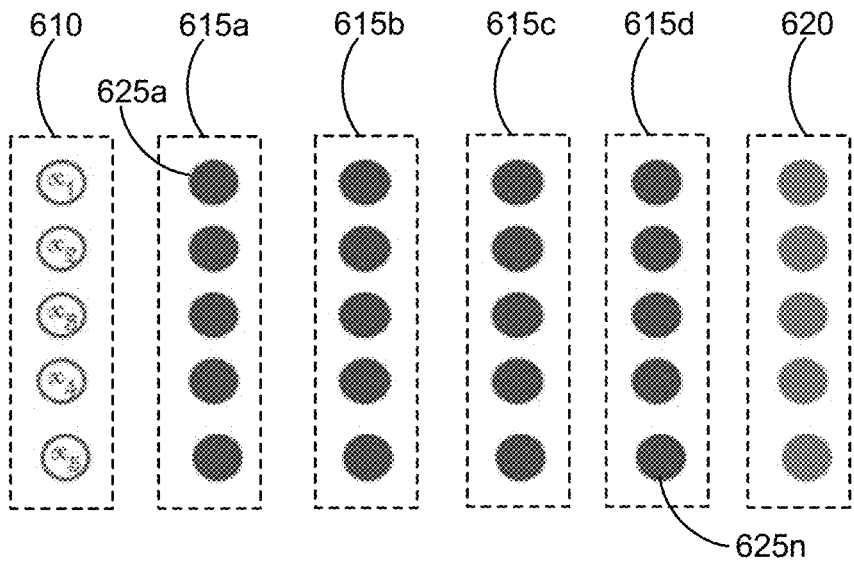
FIG. 6A is a schematic diagram of an example initial configuration of MAC units for the optimized processing engine of the IoT device of FIG. 1.

Referring now to FIG. 6A, shown therein is a schematic diagram of an example initial configuration 605 of MAC units 625a-625n determined by optimization engine 170 for performing the processing operations. FIG. 6A also shows input data vector 610 and output data vector 620. For input data vector 610 with a feature size M of 5 and a neural network model with N=4 layers, the initial configuration 605 includes 20 (M×N) MAC units. In the initial configuration 605, the 20 MAC units 625a-625n may be arranged in four layers 615a-615d corresponding to the layers of the neural network model.

The optimization engine 170 may include a MAC unit 625 corresponding to each neuron of the neural network model. Accordingly, the initial configuration 605 may correspond to a maximum number of MAC units 625. The latency time of the initial configuration 605 corresponds to 5 clock cycles and after 5 clock cycles, a new input data vector 610 can be loaded. In this example, the initial configuration 605 corresponds to a minimum latency time for performing the processing operations.

As a second example, the processing engine description input received at 305 may again specify a neural network model with N layers of neurons and an input data vector with a feature size of M. However, in the second example, the constraint parameters received at 305 may not include any latency time constraints but may instead include constraint parameters specifying one or more of the total number of the processing units, the total area of the processing units, and the total power consumption of the processing units while performing the processing operations. In this example, the initial configuration determined by the optimization engine 170 may correspond to a minimum number of the processing units and a maximum latency time for performing the set of the processing operations. If the constraint on the number of MAC units is larger than M, the initial configuration may include a single layer with M number of M MAC units. The corresponding latency time may then be M×N.

Referring back to FIG. 3, at 315, method 300 may include iteratively changing the number of the processing units from the initial number to the optimized number. The optimized number of the processing units can be operable to perform the processing operations while meeting the one or more constraint parameters. The number of the processing units may be iteratively changed from the initial number to the optimized number by, for example, optimization engine 170 shown in FIGS. 1 and 2.

In some embodiments, method 300 determines the optimized number of processing units by iteratively changing the number of the processing units from the initial number to the optimized number by iteratively changing a number of layers of the processing units. Method 300 may also determine the optimized number of processing units by iteratively changing a number of processing units per layer. In some embodiments, method 300 may determine the optimized number of processing units using a combination of changing the number of layers of the processing units and changing a number of processing units per layer.

For the first example described herein above, the constraint parameters received at 305 may include a latency time constraint but no constraints on the number of MAC units. The initial configuration corresponds to a maximum number of MAC units and a minimum latency time for performing the processing operations. In such examples, the number of the processing units may be iteratively changed by reducing the number of the processing units from the initial (maximum) number of the processing units to a minimum number of the processing units operable to perform the set of the processing operations while meeting the latency time constraint.

Method 300 may iteratively reduce the number of MAC units, one layer at a time. Reducing the number of MAC units by one layer may imply reusing a layer of MAC units to perform the corresponding processing operations and this can increase the latency time by M. The iterative reduction in the number of layers of MAC units may stop when the latency time constraint is not met. If the number of layers of MAC units is reduced to one layer with M number of MAC units and this layer still meets the latency time constraints, then the number of MAC units M may be iteratively reduced by half until the latency time constraint is not met. The number of MAC units and the corresponding latency time in the iteration immediately preceding the last iteration (where the latency time constraint is not met) can be the optimized number of MAC units and its corresponding latency time.

Figure 6B:
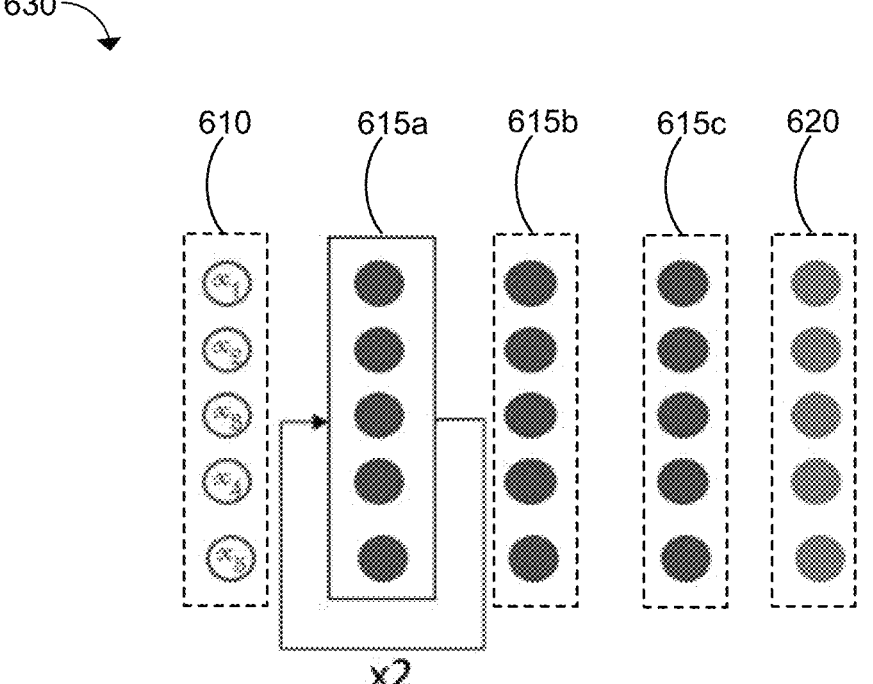
Figure 6C:
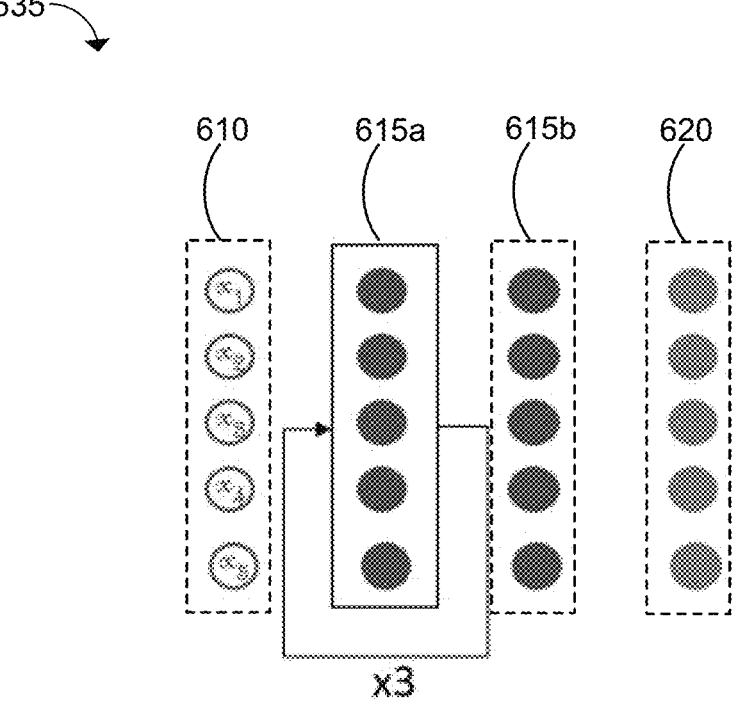
Figure 6D:
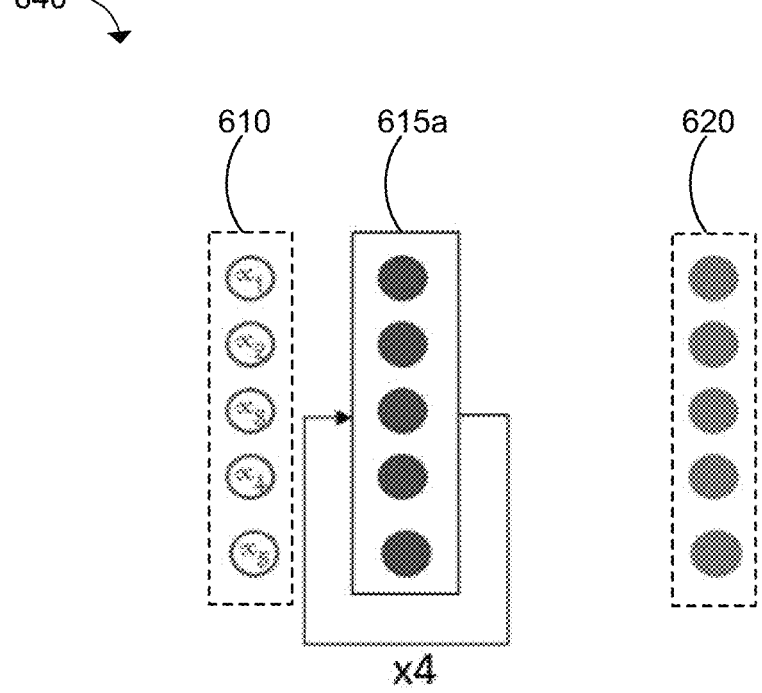

Referring now to FIGS. 6B-6D, shown therein are schematic diagrams illustrating an iterative reduction in the number of MAC units 625 starting from the initial configuration 605 shown in FIG. 6A. In the iterative configuration 630 shown in FIG. 6B, one layer of MAC units (615d) from the initial configuration 605 is reduced. The layer of MAC units 615a may be reused (total usage of layer 615a is two times) to perform the processing operations performed by layer 615d in the initial configuration. This can consume an additional 5 clock cycles. Accordingly, the latency time of configuration 630 can be 10 clock cycles compared with the latency time of 5 clock cycles of configuration 605. Method 300 may proceed to the next iteration because the latency time of 10 clock cycles of configuration 630 is lower than the latency time constraint of 1000 clock cycles.

In the iterative configuration 635 shown in FIG. 6C, one layer of MAC units (615c) from the configuration 630 is reduced. The layer of MAC units 615a may be reused two additional times (total usage of layer 615a is 3 times) to perform the processing operations performed by layer 615d in the initial configuration and by layer 615c in the configuration 630. This can consume an additional 5 clock cycles compared with the configuration 630. Accordingly, the latency time of configuration 635 can be 15 clock cycles compared with the latency time of 10 clock cycles of configuration 630. Method 300 may proceed to the next iteration because the latency time of 15 clock cycles of configuration 635 is lower than the latency time constraint of 1000 clock cycles.

In the iterative configuration 640 shown in FIG. 6D, one layer of MAC units (615b) from the configuration 635 is reduced. The layer of MAC units 615a may be reused three additional times (total usage of layer 615a is 4 times) to perform the processing operations performed by layer 615d in the initial configuration, by layer 615c in the configuration 630, and by layer 615b in configuration 635. This can consume an additional 5 clock cycles compared with the configuration 635. Accordingly, the latency time of configuration 640 can be 20 clock cycles compared with the latency time of 15 clock cycles of configuration 635. Method 300 may proceed to the next iteration (to reduce the number of MAC units per layer) because the latency time of 20 clock cycles of configuration 640 is lower than the latency time constraint of 1000 clock cycles.

For the second example described herein above, a neural network model with N layers of neurons and an input data vector with a feature size of M, the constraint parameters received at 305 may not include any latency time constraints but may instead include constraint parameters specifying a total number of the MAC units. In this example, the initial configuration determined by the optimization engine 170 may correspond to a minimum number of the processing units and a maximum latency time for performing the set of the processing operations. If the constraint on the number of MAC units is larger than M, the initial configuration may include a single layer with M number of M MAC units. The corresponding latency time may then be M×N.

At 315, method 300 may then include iteratively increasing the initial number of the MAC units to a maximum number of the MAC units operable to perform the set of the processing operations while meeting the constraint for total number of MAC units. For example, method 300 may iteratively add MAC units one layer at a time. Each new layer of MAC units may reduce the latency time by M clock cycles. The iterations may continue until the first iteration where the total number of MAC units exceeds the constraint for total number of MAC units. The number of MAC units in the iteration immediately preceding the last iteration (where the constraint was not met) can be the optimized number of MAC units.

If the constraint on the number of MAC units is smaller than M, the initial configuration can include a single MAC unit that is reused to perform the processing operations for each layer of MAC units. Method 300 may iteratively increase the initial number of the MAC units to a maximum number of the MAC units that meets the constraint parameters.

As an additional example of the optimized number of processing units, for a neural network model with input data feature size M=8, a maximum number of neurons per layer of 8, and a latency time constraint of 8 clock cycles, the optimized number can be 8 MAC units with a corresponding latency time of 8 clock cycles. If the latency time constraint in this example were changed to 16 clock cycles, the optimized number can be 4 MAC units that are reused in two consecutive sets of 8 clock cycles resulting in a latency time of 16 clock cycles. If the latency time constraint in this example were changed to 32 clock cycles, the optimized number can be 2 MAC units that are reused in four consecutive sets of 8 clock cycles resulting in a latency time of 32 clock cycles.

The latency time corresponding to the optimized number of MAC units may not always be equal to the maximum latency time constraint. Method 300 may optimize the number of MAC units so that the corresponding latency time is less than the maximum latency time constraint. This can enable a reduction in MAC unit density when a higher latency time is acceptable for a target application.

In some embodiments, the constraint parameters may specify a total area of the MAC units or a total power consumption of the MAC units while performing the processing operations. Method 300 can include determining a constraint of the total number of MAC units that corresponds to the total area or the total power consumption of the MAC units (e.g., based on the semiconductor process technology used for implementation of the MAC units). The optimized number of MAC units can then consume total power or total area that meets the received constraints.

In some embodiments, the constraint parameters received at 305 may include a latency time constraint and constraints on the number of processing units. In such examples, the determination of the number of processing units may be performed using heuristic algorithms or multi objective optimization to find solutions in the pareto optimal front, weighted sum of weights, etc. The optimization problem may be expressed as follows:

$$\min(f_1(x), f_2(x), \ldots f_k(x)) \text{ subject to } x \in X \qquad \text{(Equation 11)}$$

where k≥2 is the number of objectives and the set of X is the feasible decision set. The objectives can include the received constraint parameters.

Referring back to FIG. 3, at 320, method 300 may include generating the optimized processing engine based on the determined optimized number of the processing units. For example, engine generation device 160 may generate the optimized processing engine 120 based on the optimized number of the processing units determined at 315. The output defining the optimized processing engine may be generated in different formats including, for example, RTL format, Netlist format or GDS format.

Figure 7:
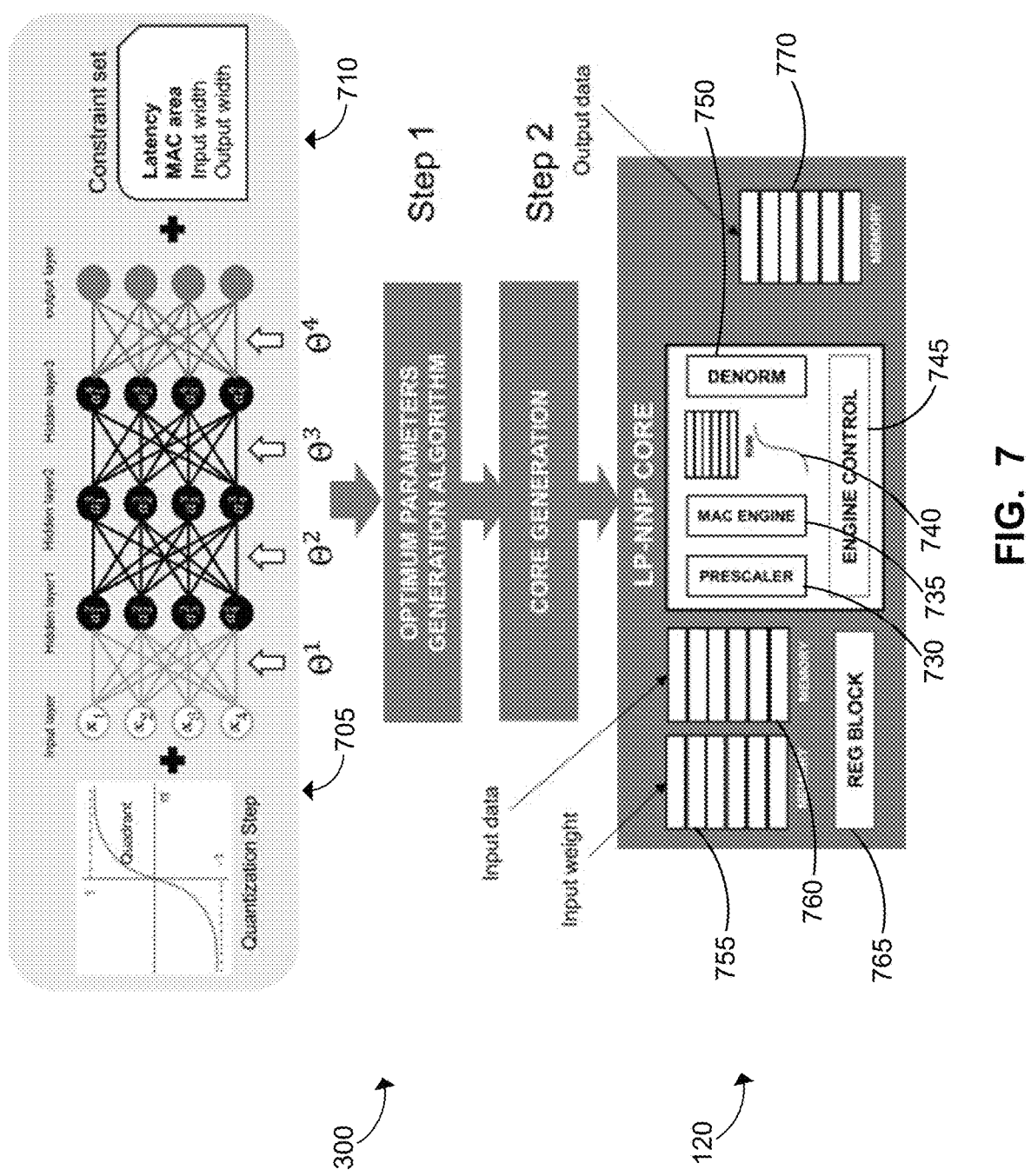
FIG. 7 is a schematic diagram showing an optimized processing engine generated using the method of FIG. 3.

Reference is now made to FIG. 7 showing a schematic diagram of an optimized processing engine 120 generated using method 300. As described herein above, method 300 can include receiving an engine description input and one or more constraint parameters 710. The engine description input 705 can, for example, specify that the processing engine includes a neural network model, the number of layers in the neural network model, the maximum number of neurons per layer, the feature size, and a matrix of weights corresponding to the layers. In some embodiments, the engine description input 705 may include a quantization input specifying an activation function. For example, the quantization input may include a sigmoid quantization parameter specifying the number of bits used to represent the data in a ROM look-up table for computing a sigmoid activation function. The constraint parameters 710 can include constraints associated with one or more of a total number of the processing units, a total area of the processing units, a total power consumption of the processing units while performing the processing operations, a latency time constraint of the processing units to perform a set of the processing operations, an input data width of the processing engine and an output data width of the processing engine.

The optimized processing engine 120 may be generated using method 300 as described herein above. As shown in FIG. 7, the optimized processing engine 120 may include a pre-scaler engine 730, an optimized number of processing units 735, an activation function engine 740, an engine controller 745, a denormalization engine 750, memory blocks 755, 760, 770, and a register block 765.

Memory block 760 may have any design suitable to store the input data of the IoT device that needs to be processed. For example, the input data can include video data for a video camera IoT device or audio data for a hearing aid IoT device. In some embodiments, the input data may be stored in memory block 760 using a defined convention. For example, the input data may be stored in a sequence $x_1$ to $x_M$, where M is the feature size of the input data vector. The memory block 760 may be designed to support any number of input data vectors at a given time.

Memory block 755 may have any design suitable to store the processing parameters for performing the processing operations. For example, the processing parameters may include a matrix of weights corresponding to the layers of a neural network model. In some embodiments, the processing parameters may be stored in memory block 755 using a defined convention. For example, the processing parameters may be stored in a sequence $\theta_1$ to $\theta_N$, where N is the total number of layers in the neural network model.

Register block 765 may have any design suitable to store one or more control parameters. For example, register block 765 may store the input data width of the optimized processing engine 120. The optimized processing engine 120 may support different input data widths.

Pre-scaler engine 730 may have any design suitable to automatically adjust the data width of received input data to an input width of the processing units 735. Pre-scaler engine 730 may perform the adjustment by multiplying the received input data with a predetermined pre-scaler value. For example, equation 12 may be used to represent an i-bit input N into a j-bit value Ň.

$$\check{N} = \frac{N(2^j - 1)}{2^i - 1} \qquad \text{(Equation 12)}$$

The activation function engine 740 can have any design suitable to implement an activation function, for example, a sigmoid activation function. In some embodiments, the activation function engine 740 may include a ROM look-up table configured to implement the sigmoid activation function.

The output of each of the processing units 735 may be provided as an input to the activation function engine 740. The input to the activation function engine 740 may be converted into an index to address the ROM look-up table. In some embodiments, the output of the ROM look-up table may be defined as follows:

$$\text{If } \sigma = 0 \text{ then} \qquad \text{(Equation 13)}$$
$$\text{output} = \hat{y}_i$$
$$\text{else if } \sigma \ge \sigma_{m-1} \text{ then}$$
$$\text{output} = \hat{y}_m$$
$$\text{else for } I \text{ in 1 to } m\text{-1}$$
$$\text{if } \sigma_i \le \sigma < \sigma_{i+1} \text{ then output} = \hat{y}_i$$
$$\text{end loop}$$

This may be accomplished in two steps—i) the index of the ROM look-up table cell that stores $\hat{y}_i$ can be obtained from the value of a and ii) the value stored in the indexed ROM look-up table cell is read.

In some embodiments, the number of processing units 735 may be optimized to reuse the processing units 735 while performing a set of processing operations (e.g., as described herein above with reference to FIGS. 6B-6D). In such cases, the output of the ROM look-up table may be stored in a register for future reference. After a set of processing operations is completed (e.g., computation of a single layer convolution), the output of the ROM look-up table may be provided to the denormalization engine 750.

The denormalization engine 750 may have any design suitable to automatically adjust the output width of the processing units 735 to a required output data width of the optimized processing engine 120. The denormalization engine 750 may be configured to perform a denormalization operation complementary to the pre-scaling operation. For example, equation 14 may be used to represent a j-bit value Ň into an i-bit input N.

$$N = \frac{\check{N}(2^i - 1)}{2^j - 1} \qquad \text{(Equation 14)}$$

The output of the denormalization engine 750 may be provided to memory block 770. The memory block 770 may have any design suitable to store the denormalized output. The denormalized data stored in the memory block 770 may be further processed by the IoT device or used to make decisions. For example, a hearing aid IoT device may determine the type of environment (e.g., indoors, outdoors, busy street, theater) of a user and adjust the hearing experience accordingly based on the denormalized data.

The engine controller 745 may have any design suitable to control various aspects of the optimized processing engine 120. For example, the engine controller 745 may monitor the operations of the processing units 735 and switch off the clock signal and/or input power to any unused processing units 735 to reduce total power consumption of the IoT device.

In some embodiments, engine controller 745 may be configured to control a loading sequence of the input data and the one or more processing parameters to the processing units 735 while performing the processing operations.

Figure 8:
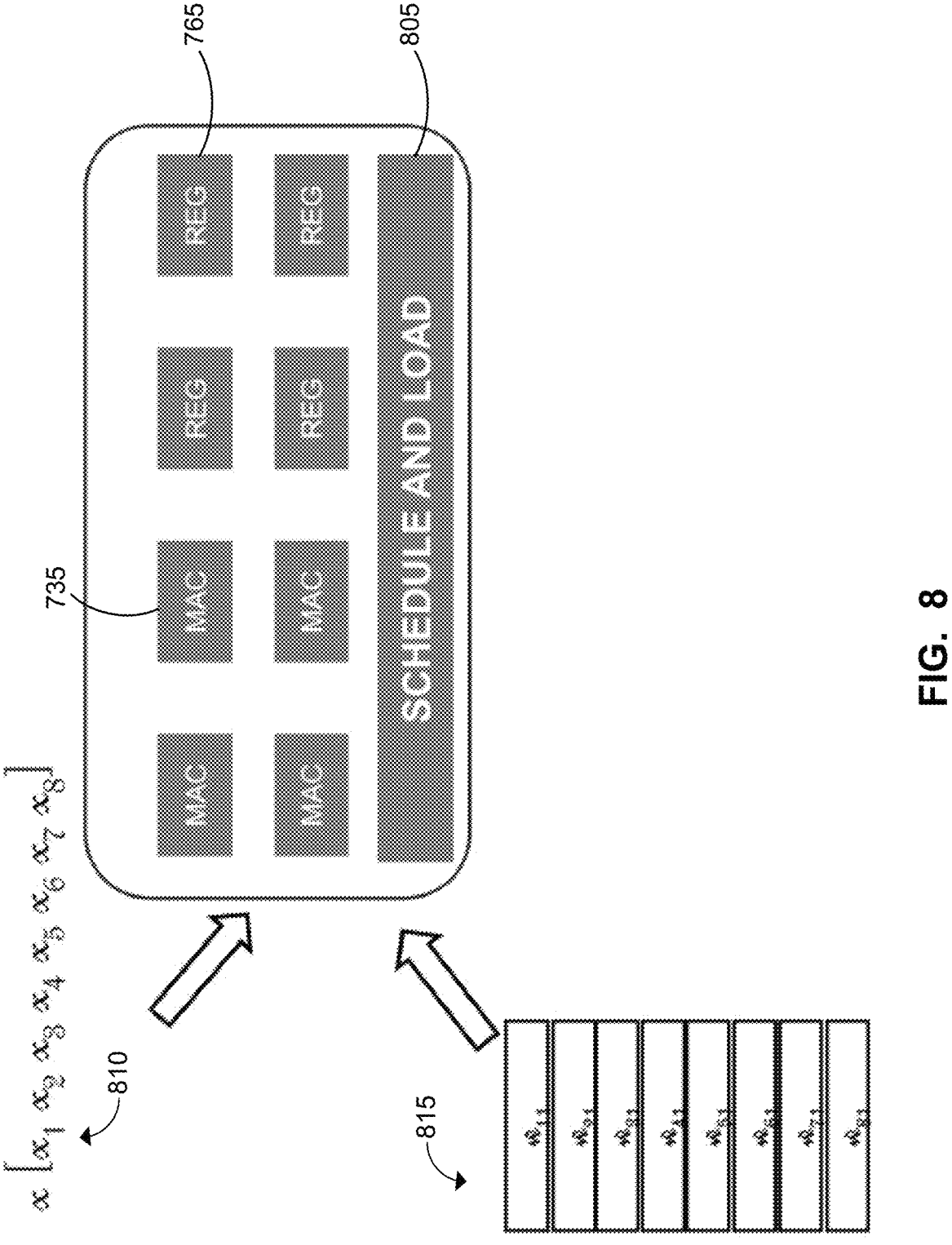
FIG. 8 is a schematic diagram showing a schedule and load module of an engine controller of the optimized processing engine of FIG. 7.

Referring now to FIG. 8, shown therein is a schematic diagram showing a schedule and load module 805 of the engine controller. The schedule and load module 805 may have any design suitable to control the loading sequence of the input data and processing parameters to the processing units.

For example, the optimized processing engine may include a neural network model and the processing units may include MAC units 735. The schedule and load module 805 may control the loading sequence of the input data vector 810 and a matrix of weights 815 to MAC units 735 to perform the convolution operations for one layer of the neural network model. As described herein above, the optimized processing engine may include an optimized number of MAC units 735, wherein the MAC units 735 may be reused while performing the convolution operations for one layer. The schedule and load module 805 may control the storage of intermediate convolution results generated by MAC units 735 in register block 765.

Figure 9:
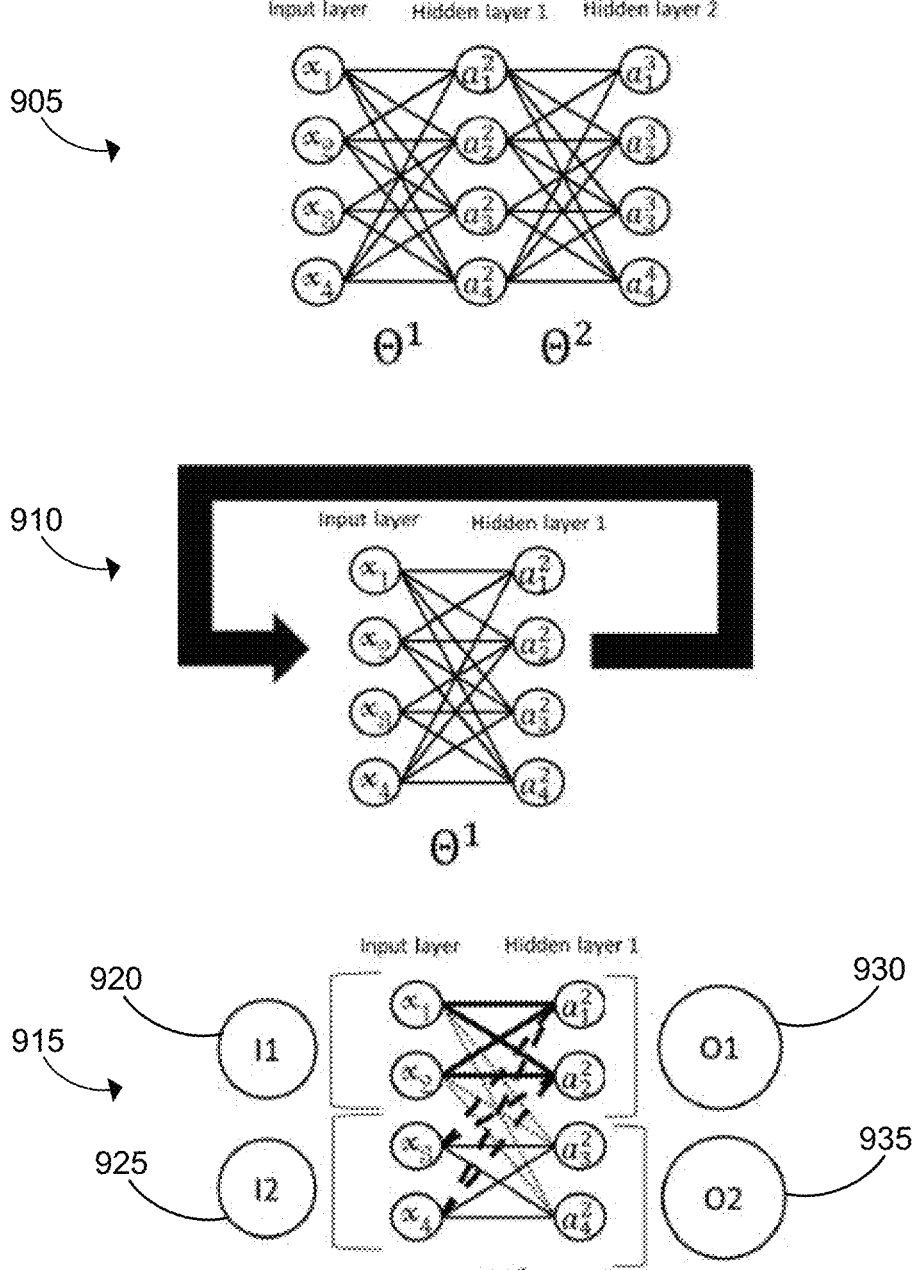
FIG. 9 is a schematic diagram of the loading sequences used for different implementations of the optimized processing engine of FIG. 7.

Referring now to FIG. 9, shown therein are schematic illustrations of the loading sequences 905, 910, and 915 used for different implementations of the optimized processing engine. The loading sequences 905, 910 and 915 may be controlled, for example, by the schedule and load module 805 (shown in FIG. 8) of the engine controller 745 (shown in FIG. 7).

In some cases (e.g., loading sequence 905), there may be no reuse of the number of MAC units between layer j and layer j+1 of a neural network model that has M neurons in layer j and N neurons in layer j+1. In this case, the schedule and load module 805 may read and load N input data per weight for M consecutive clock cycles. At the end of the $M^{th}$ clock cycle, the accumulated contents of the MAC units may contain the convolution output that may be provided to an activation function. The MAC units may then be ready to be used for the next convolution computation immediately after the M clock cycles.

In some cases (e.g., loading sequence 910), the optimized processing engine may reuse the MAC units for convolution computations between layer j and layer j+1 of a neural network model. In this case, the schedule and load module 805 may read and load N input data per weight for M consecutive clock cycles. At the end of the $M^{th}$ clock cycle, the accumulated contents of the MAC unit may contain the convolution output that may be provided to an activation function. The MAC units may then be reused for the convolution computation of the next layer and may not be available immediately for the next convolution computation. This may result in a higher latency time for the optimized processing engine compared with the loading sequence 905.

In some cases (e.g., loading sequence 915), the total number of MAC units may be less than the number of neurons in each layer. The optimized processing engine may reuse the MAC units for convolution computations within each layer and also between layer j and layer j+1 of a neural network model. In this case, the schedule and load module 805 may load the two inputs 920 along with their corresponding weights in a first step. Next, the schedule and load module 805 may load the two inputs 925 along with their corresponding weights in a second step. At the end of the second step, the two convolution outputs 930 may be available. In a similar manner, the schedule and load module 805 may load the inputs 920 and 925 in a third and fourth step to obtain the convolution output 935. Each of the four steps can consume a total number of clock cycles equal to the number of data inputs loaded in each step. This may result in a higher latency time for the optimized processing engine compared with the loading sequences 905 and 910.

Figure 10A:
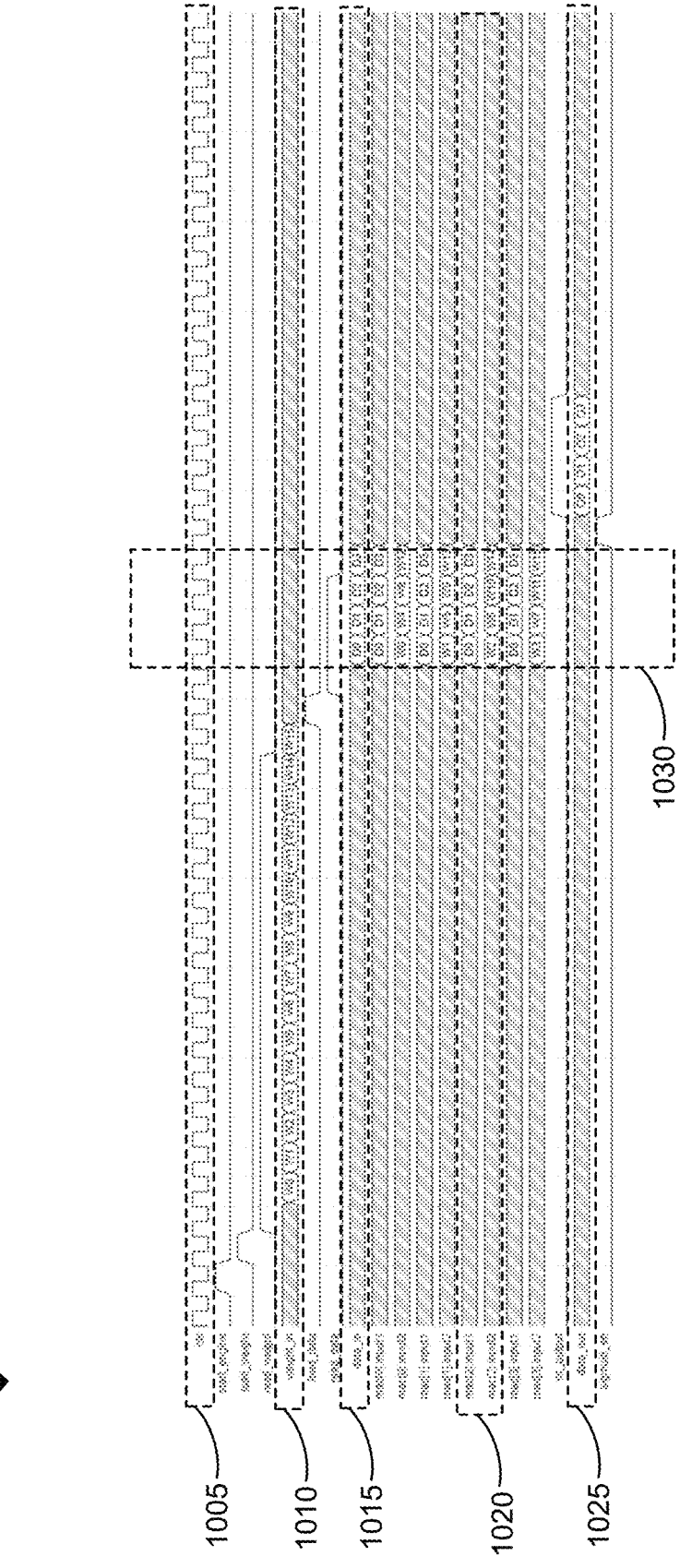
FIGS. 10A and 10B are example timing diagrams for loading sequences of the processing units of the optimized processing engine of FIG. 7.
Figure 10B:
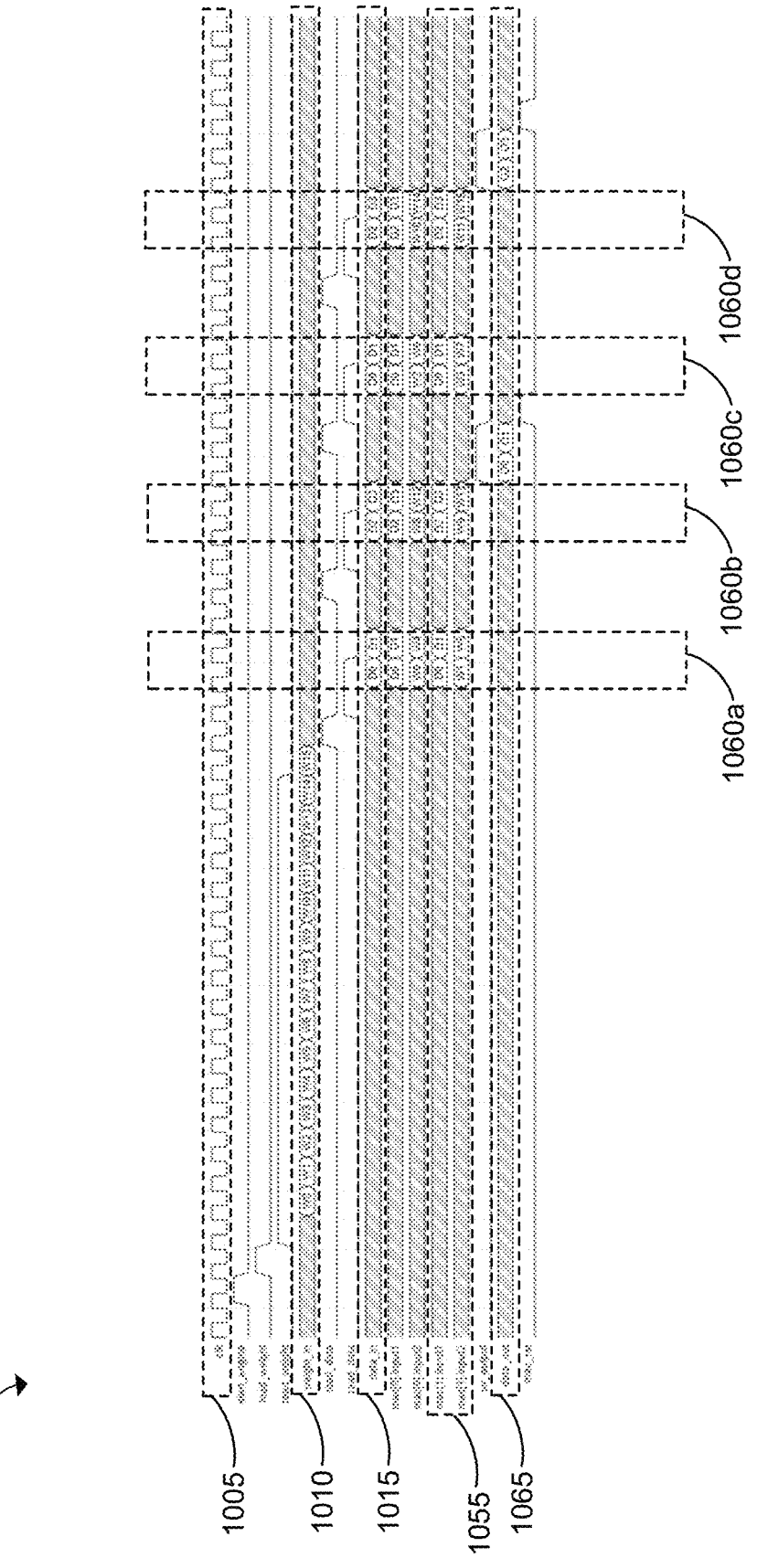

Reference is next made to FIGS. 10A and 10B showing example timing diagrams 1000 and 1050 for loading sequences of the processing units of an optimized processing engine. The optimized processing engine can for example include a neural network model with four neurons per layer and a feature size of four. The timing diagrams 1000 and 1050 show the loading sequence for convolution computations corresponding to one layer of the neural network model. The timing diagrams 1000 and 1050 show a clock signal 1005 and loading sequence 1015 for an input data vector (including input data $D_0$-$D_3$). Timing diagrams 1000 and 1050 also show the loading sequence 1010 for the weights (matrix of weights $W_0$-$W_{15}$) used in the convolution computation.

Timing diagram 1000 shows the loading sequence where the optimized processing engine includes four MAC units. The MAC units do not need to be reused and the schedule and load module 805 can control the loading sequence to utilize each MAC unit to perform the convolution computation corresponding to one neuron of the layer (e.g., FIG. 10A shows the loading sequence 1020 of the input data $D_0$-$D_3$ and the corresponding weights W2, W6, W10 and W14 for one of the MAC units). As shown in FIG. 10A, the input data and the weights can be loaded in sequence during four consecutive clock cycles 1030 and the output sequence 1025 of the convolution computation can be obtained.

Timing diagram 1050 shows the loading sequence where the optimized processing engine includes two MAC units. Each of the two MAC units may need to be reused to perform the convolution computation for two neurons of the layer. For example, FIG. 10B shows the loading sequence 1055 of the input data $D_0$-$D_3$ and the corresponding weights for one of the MAC units. The schedule and load module 805 can control the loading sequence 1055 to utilize the MAC unit to perform the convolution computation corresponding to a first neuron in a first step (e.g., total of four clock cycles labelled 1060a and 1060b) and then perform the convolution computation corresponding to a second neuron in a second step (e.g., total of four clock cycles labelled 1060c and 1060d). The timing diagram 1050 also shows the corresponding output sequence 1065 for the first and second steps. The reduction of the number of MAC units from four in FIG. 10A to two in FIG. 10B can increase the latency time from four clock cycles to eight clock cycles.

Figure 11:
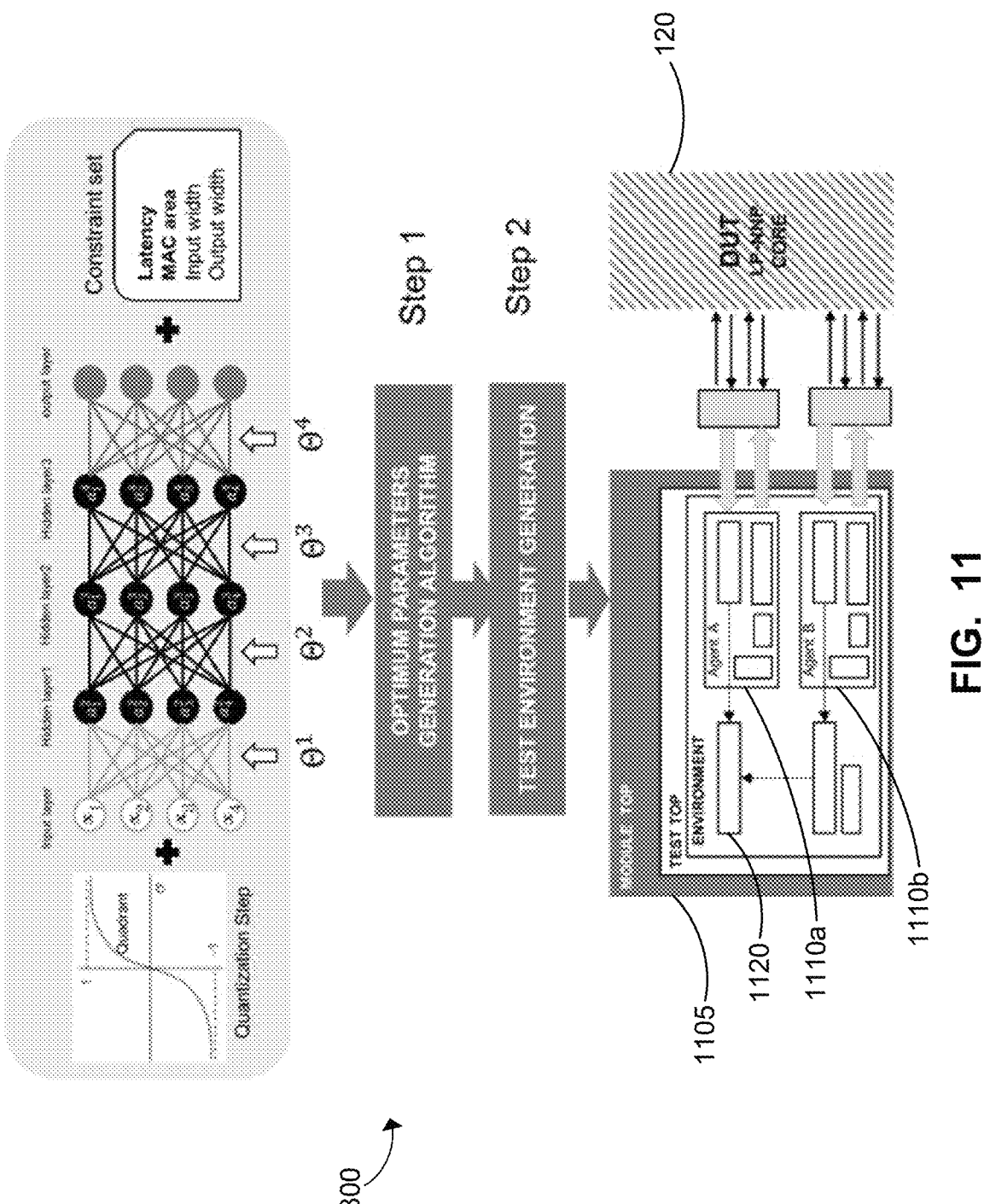
FIG. 11 shows a schematic diagram of an example validation test bench that can be used for testing and validation of the optimized processing engine of FIG. 7.

Referring now to FIG. 11, shown therein is a schematic diagram of a validation test bench 1105 that can be used for testing and validation of the optimized processing engine 120. In some embodiments, the engine generation device 160 can generate the validation test bench 1105.

The validation test bench 1105 can include an automated testing environment for testing and validation of the optimized processing engine 120. The automated test environment may include one or more agents 1110 (e.g. agents 1110a and 1110b shown in FIG. 11). The agents 1110 may generate a test vector that can be used as a test input data vector for the optimized processing engine 120. The agents 1110 may generate a random test vector. In some embodiments, the test vector may be predefined.

The agents 1110 can provide the test vectors to the optimized processing engine 120 and also to a prediction engine 1120 included in the validation test bench 1105. The prediction engine 1120 can use a loading sequence similar to that used by the schedule and load module 805. The agent 1110 can compare the results generated by the optimized processing engine 120 with the results from the prediction engine 1120. Matching results can be used to validate the optimized processing engine 120.

While the above description provides examples of the embodiments, it will be appreciated that some features and/or functions of the described embodiments are susceptible to modification without departing from the spirit and principles of operation of the described embodiments. Accordingly, what has been described above has been intended to be illustrative of the invention and non-limiting and it will be understood by persons skilled in the art that other variants and modifications may be made without departing from the scope of the invention as defined in the claims appended hereto. The scope of the claims should not be limited by the preferred embodiments and examples, but should be given the broadest interpretation consistent with the description as a whole.

Clauses

Clause 1: An optimized processing engine of an Internet of Things (IoT) device, the optimized processing engine configured to perform processing operations on input data received at the IoT device, wherein the optimized processing engine comprises: an optimized number of processing units, each processing unit configured to perform one or more of the processing operations; a memory unit configured to store (i) the input data, (ii) one or more processing parameters for performing the processing operations, and (iii) one or more intermediate outputs of the processing units while performing the processing operations; and an engine controller configured to control a loading sequence of the input data and the one or more processing parameters to the processing units while performing the processing operations, wherein the optimized number of the processing units is determined by an optimization engine of an engine generation device by: determining an initial number of the processing units for performing the processing operations based on a processing engine description input and one or more constraint parameters associated with the processing units; and iteratively changing the number of the processing units from the initial number to the optimized number, wherein the optimized number of the processing units is operable to perform the processing operations while meeting the one or more constraint parameters.

Clause 2: The optimized processing engine of any of the above clauses, wherein the one or more constraint parameters include one or more of (i) a total number of the processing units, (ii) a total area of the processing units, (iii) a total power consumption of the processing units while performing the processing operations, and (iv) a latency time constraint of the processing units to perform a set of the processing operations.

Clause 3: The optimized processing engine of any of the above clauses, wherein: the one or more constraint parameters include the latency time constraint; the initial number of the processing units corresponds to (i) a maximum number of the processing units and (ii) a minimum latency time, for performing the set of the processing operations; and iteratively changing the number of the processing units from the initial number to the optimized number includes iterative reduction from the initial number of the processing units to a minimum number of the processing units operable to perform the set of the processing operations while meeting the latency time constraint.

Clause 4: The optimized processing engine of any of the above clauses, wherein: the one or more constraint parameters include one or more of the total number of the processing units, the total area of the processing units, and the total power consumption of the processing units while performing the processing operations; the initial number of processing units corresponds to (i) a minimum number of the processing units and (ii) a maximum latency time, for performing the set of the processing operations; and iteratively changing the number of the processing units from the initial number to the optimized number includes iteratively increasing the initial number of the processing units to a maximum number of the processing units operable to perform the set of the processing operations while meeting the one or more constraint parameters.

Clause 5: The optimized processing engine of any of the above clauses, wherein the processing engine includes a neural network model having one or more layers; and the one or more processing parameters for performing the processing operations include a matrix of weights corresponding to the one or more layers.

Clause 6: The optimized processing engine of any of the above clauses, wherein the processing engine description input includes one or more of a number of layers in the neural network model, a maximum number of neurons per layer in the neural network model, a feature size of the neural network model, an input width of the processing engine, and an output width of the processing engine.

Clause 7: The optimized processing engine of any of the above clauses, wherein the processing units include multiply-accumulate (MAC) units arranged in layers corresponding to the layers in the neural network model.

Clause 8: The optimized processing engine of any of the above clauses, wherein the optimized number of the processing units includes reusing a layer of the MAC units to perform the processing operations for a first layer and a second layer of the neural network model; and the engine controller is configured to sequentially (i) load the MAC units of the reused layer with inputs and weights corresponding to the first layer, (ii) store intermediate outputs of the MAC units of the reused layer in the memory unit, and (iii) load the MAC units of the reused layer with inputs and weights corresponding to the second layer.

Clause 9: The optimized processing engine of any of the above clauses, wherein iteratively changing the number of the processing units from the initial number to the optimized number includes iteratively changing a number of layers of the MAC units followed by iteratively changing a number of MAC units per layer of the MAC units.

Clause 10: The optimized processing engine of any of the above clauses, wherein iteratively changing the number of the processing units from the initial number to the optimized number includes iteratively changing a number of MAC units per layer of the MAC units followed by iteratively changing a number of layers of the MAC units.

Clause 11: The optimized processing engine of any of the above clauses, wherein the one or more processing parameters for performing the processing operations includes a quantization input specifying a sigmoid activation function.

Clause 12: The optimized processing engine of any of the above clauses, wherein the sigmoid activation function is included in the optimized processing engine as a read-only memory (ROM) look-up table stored in the memory unit.

Clause 13: The optimized processing engine of any of the above clauses, wherein the sigmoid activation function is included in the optimized processing engine as a Taylor series decomposition hardware implementation.

Clause 14: The optimized processing engine of any of the above clauses, further comprising a pre-scaler engine configured to perform a pre-scaling operation to adjust a data width of the input data to an input width of the processing units of the optimized processing engine.

Clause 15: The optimized processing engine of any of the above clauses, further comprising a denormalization engine configured to perform a denormalization operation complementary to the pre-scaling operation to adjust an output width of an output of the optimized processing engine.

Clause 16: The optimized processing engine of any of the above clauses, wherein the engine controller is further configured to monitor operation of the processing units; and switch off at least one of a clock signal and an input power to any processing units not being used by the optimized processing engine to perform the processing operations.

Clause 17: The optimized processing engine of any of the above clauses, wherein the engine generation device is configured to generate an automated testing environment for testing and validation of the optimized processing engine.

Clause 18: The optimized processing engine of any of the above clauses, wherein the engine generation device is configured to generate an output defining the optimized processing engine in one or more of a Register Transfer Level Language (RTL) format, a Netlist format or a Graphic Data System (GDS) format.

Clause 19: The optimized processing engine of any of the above clauses, wherein the processing engine includes a Kalman filter estimator.

Clause 20: The optimized processing engine of any of the above clauses, wherein the processing units include systolic arrays.

Clause 21: An IoT device comprising the optimized processing engine of any one of the above clauses.

Clause 22: A method of generating an optimized processing engine of an Internet of Things (IoT) device, the optimized processing engine configured to perform processing operations on input data received at the IoT device, wherein the optimized processing engine includes: an optimized number of processing units, each processing unit configured to perform one or more of the processing operations; a memory unit configured to store (i) the input data, (ii) one or more processing parameters for performing the processing operations, and (iii) one or more intermediate outputs of the processing units while performing the processing operations; and an engine controller configured to control a loading sequence of the input data and the one or more processing parameters to the processing units while performing the processing operations, wherein the method comprises: determining, by an optimization engine of an engine generation device, the optimized number of the processing units by: receiving a processing engine description input and one or more constraint parameters associated with the processing units; determining an initial number of the processing units for performing the processing operations based on the processing engine description input and the one or more constraint parameters; and iteratively changing the number of processing units from the initial number to the optimized number, wherein the optimized number of processing units is operable to perform the processing operations while meeting the one or more constraint parameters; and generating, by the engine generation device, the optimized processing engine based on the determined optimized number of the processing units.

I claim:

1. An optimized processing engine of an Internet of Things (IoT) device, the optimized processing engine configured to perform processing operations on input data received at the IoT device, wherein the optimized processing engine comprises:

23 an optimized number of processing units, each processing unit configured to perform one or more of the processing operations;

a memory unit configured to store (i) the input data, (ii) one or more processing parameters for performing the processing operations, and (iii) one or more intermediate outputs of the processing units while performing the processing operations; and an engine controller configured to control a loading sequence of the input data and the one or more processing parameters to the processing units while performing the processing operations, wherein the optimized number of the processing units is determined by an optimization engine of an engine generation device by:

determining an initial number of the processing units for performing the processing operations based on a processing engine description input and one or more constraint parameters associated with the processing units; and iteratively changing the number of the processing units from the initial number to the optimized number, wherein the optimized number of the processing units is operable to perform the processing operations while meeting the one or more constraint parameters, and wherein the processing engine includes a neural network model having one or more layers, the processing units include multiply-accumulate (MAC) units arranged in layers corresponding to the one or more layers in the neural network model, and iteratively changing the number of the processing units from the initial number to the optimized number includes:

starting iterations from the initial number of the processing units, the initial number being determined to meet the one or more constraint parameters;

iteratively changing a number of layers of the MAC units and a number of MAC units per layer of the MAC units until a first iteration for which the one or more constraint parameters are not met; and selecting the optimized number of the processing units based on the number of layers of the MAC units and the number of MAC units per layer for an iteration immediately preceding the first iteration.

2. The optimized processing engine of claim 1, wherein the one or more constraint parameters include one or more of (i) a total number of the processing units, (ii) a total area of the processing units, (iii) a total power consumption of the processing units while performing the processing operations, and (iv) a latency time constraint of the processing units to perform a set of the processing operations.

3. The optimized processing engine of claim 2, wherein:

the one or more constraint parameters include the latency time constraint;

the initial number of the processing units corresponds to (i) a maximum number of the processing units and (ii) a minimum latency time, for performing the set of the processing operations; and iteratively changing the number of the processing units from the initial number to the optimized number includes iterative reduction from the initial number of the processing units to a minimum number of the processing units operable to perform the set of the processing operations while meeting the latency time constraint.

4. The optimized processing engine of claim 2, wherein:

the one or more constraint parameters include one or more of the total number of the processing units, the total area of the processing units, and the total power consumption of the processing units while performing the processing operations;

the initial number of processing units corresponds to (i) a minimum number of the processing units and (ii) a maximum latency time, for performing the set of the processing operations; and iteratively changing the number of the processing units from the initial number to the optimized number includes iteratively increasing the initial number of the processing units to a maximum number of the processing units operable to perform the set of the processing operations while meeting the one or more constraint parameters.

5. The optimized processing engine of claim 1, wherein the one or more processing parameters for performing the processing operations include a matrix of weights corresponding to the one or more layers.

6. The optimized processing engine of claim 5, wherein the processing engine description input includes one or more of a number of layers in the neural network model, a maximum number of neurons per layer in the neural network model, a feature size of the neural network model, an input width of the processing engine, and an output width of the processing engine.

7. The optimized processing engine of claim 6, wherein the optimized number of the processing units includes reusing a layer of the MAC units to perform the processing operations for a first layer and a second layer of the neural network model; and the engine controller is configured to sequentially (i) load the MAC units of the reused layer with inputs and weights corresponding to the first layer, (ii) store intermediate outputs of the MAC units of the reused layer in the memory unit, and (iii) load the MAC units of the reused layer with inputs and weights corresponding to the second layer.

8. The optimized processing engine of claim 6, wherein iteratively changing the number of the processing units from the initial number to the optimized number includes iteratively changing the number of layers of the MAC units followed by iteratively changing the number of MAC units per layer of the MAC units.

9. The optimized processing engine of claim 6, wherein iteratively changing the number of the processing units from the initial number to the optimized number includes iteratively changing the number of MAC units per layer of the MAC units followed by iteratively changing the number of layers of the MAC units.

10. The optimized processing engine of claim 1, wherein the one or more processing parameters for performing the processing operations includes a quantization input specifying a sigmoid activation function.

11. The optimized processing engine of claim 10, wherein the sigmoid activation function is included in the optimized processing engine as a read-only memory (ROM) look-up table stored in the memory unit.

12. The optimized processing engine of claim 10, wherein the sigmoid activation function is included in the optimized processing engine as a Taylor series decomposition hardware implementation.

13. The optimized processing engine of claim 1, further comprising a pre-scaler engine configured to perform a pre-scaling operation to adjust a data width of the input data to an input width of the processing units of the optimized processing engine.

14. The optimized processing engine of claim 13, further comprising a denormalization engine configured to perform a denormalization operation complementary to the pre-scaling operation to adjust an output width of an output of the optimized processing engine.

15. The optimized processing engine of claim 1, wherein the engine controller is further configured to monitor operation of the processing units; and switch off at least one of a clock signal and an input power to any processing units not being used by the optimized processing engine to perform the processing operations.

16. The optimized processing engine of claim 1, wherein the engine generation device is configured to generate an automated testing environment for testing and validation of the optimized processing engine.

17. The optimized processing engine of claim 1, wherein the engine generation device is configured to generate an output defining the optimized processing engine in one or more of a Register Transfer Level Language (RTL) format, a Netlist format or a Graphic Data System (GDS) format.

18. The optimized processing engine of claim 1, wherein the processing engine includes a Kalman filter estimator.

19. The optimized processing engine of claim 18, wherein the processing units include systolic arrays.

20. An IoT device comprising the optimized processing engine of any one of claims 1-6 or 7-19.

21. A method of generating an optimized processing engine of an Internet of Things (IoT) device, the optimized processing engine configured to perform processing operations on input data received at the IoT device, wherein the optimized processing engine includes:

an optimized number of processing units, each processing unit configured to perform one or more of the processing operations;

a memory unit configured to store (i) the input data, (ii) one or more processing parameters for performing the processing operations, and (iii) one or more interme-diate outputs of the processing units while performing the processing operations; and an engine controller configured to control a loading sequence of the input data and the one or more processing parameters to the processing units while performing the processing operations, wherein the processing engine includes a neural network model having one or more layers, the processing units include multiply-accumulate (MAC) units arranged in layers corresponding to the one or more layers in the neural network model, and wherein the method comprises:

determining, by an optimization engine of an engine generation device, the optimized number of the processing units by:

receiving a processing engine description input and one or more constraint parameters associated with the processing units;

determining an initial number of the processing units for performing the processing operations based on the processing engine description input and the one or more constraint parameters; and iteratively changing the number of processing units from the initial number to the optimized number by:

iteratively changing a number of layers of the MAC units and a number of MAC units per layer of the MAC units until a first iteration for which the one or more constraint parameters are not met, and selecting the optimized number of the processing units based on the number of layers of the MAC units and the number of MAC units per layer for an iteration immediately preceding the first iteration, wherein the optimized number of processing units is operable to perform the processing operations while meeting the one or more constraint parameters; and generating, by the engine generation device, the optimized processing engine based on the determined optimized number of the processing units.

* * * * *